United States Patent
Hirota et al.

(10) Patent No.: US 7,859,527 B2
(45) Date of Patent: Dec. 28, 2010

(54) DISPLAY DEVICE, METHOD OF DRIVING THE SAME AND ELECTRIC EQUIPMENT

(75) Inventors: Shoichi Hirota, Tokyo (JP); Susumu Edo, Tokyo (JP); Hiroki Kaneko, Tokyo (JP); Tetsuya Oshima, Tokyo (JP); Tatsuya Sugita, Tokyo (JP); Shinichi Komura, Tokyo (JP); Katsuyuki Funahata, Tokyo (JP)

(73) Assignee: Hitachi Displays, Ltd., Chiba (JP)

( * ) Notice: Subject to any disclaimer, the term of this patent is extended or adjusted under 35 U.S.C. 154(b) by 1206 days.

(21) Appl. No.: 10/946,608

(22) Filed: Sep. 21, 2004

(65) Prior Publication Data
US 2005/0068279 A1   Mar. 31, 2005

(30) Foreign Application Priority Data

| Sep. 25, 2003 | (JP) | ............................. 2003-333606 |
| Jul. 8, 2004 | (JP) | ............................. 2004-201899 |

(51) Int. Cl.
  *G09G 5/00* (2006.01)
  *G06F 3/038* (2006.01)
(52) U.S. Cl. ........................... 345/208; 345/94; 345/107
(58) Field of Classification Search .................. 345/87, 345/94, 100, 76, 82, 204, 213, 690, 208, 345/107; 315/169.1, 169.3
See application file for complete search history.

(56) References Cited

U.S. PATENT DOCUMENTS

| 5,581,273 A | * | 12/1996 | Yoneda et al. ................. 345/90 |
| 6,680,580 B1 | * | 1/2004 | Sung ......................... 315/169.3 |
| 6,809,706 B2 | * | 10/2004 | Shimoda ....................... 345/55 |
| 2002/0018056 A1 | * | 2/2002 | Ozawa et al. ............... 345/204 |
| 2002/0036628 A1 | * | 3/2002 | Uehara et al. ............... 345/204 |
| 2002/0075422 A1 | * | 6/2002 | Kimura et al. ................. 349/43 |
| 2003/0137521 A1 | * | 7/2003 | Zehner et al. ................ 345/589 |

FOREIGN PATENT DOCUMENTS

| JP | 02-272521 | 11/1990 |
| JP | 09-185087 | 7/1997 |
| JP | 11-202804 | 7/1999 |
| JP | 2002-116734 | 4/2002 |

* cited by examiner

*Primary Examiner*—Stephen G Sherman
(74) *Attorney, Agent, or Firm*—Antonelli, Terry, Stout & Kraus, LLP

(57) ABSTRACT

A reference voltage line is synchronously scanned with scanning of a scanning signal line, voltage of the reference voltage line is set to be the voltage of a common electrode, the second transistor is set to be OFF state during the reference voltage line is set in the common voltage for a pixel wherein a node between an image signal memory and said second transistor is set in a voltage so that said second transistor becomes OFF and the voltage of image signal line is set to be high voltage level when the voltage of the scanning signal line changes from low voltage level to high voltage level for the pixel wherein the node between the image signal memory and the second transistor is set in a voltage so that said second transistor becomes ON.

5 Claims, 36 Drawing Sheets

F I G. 1 4
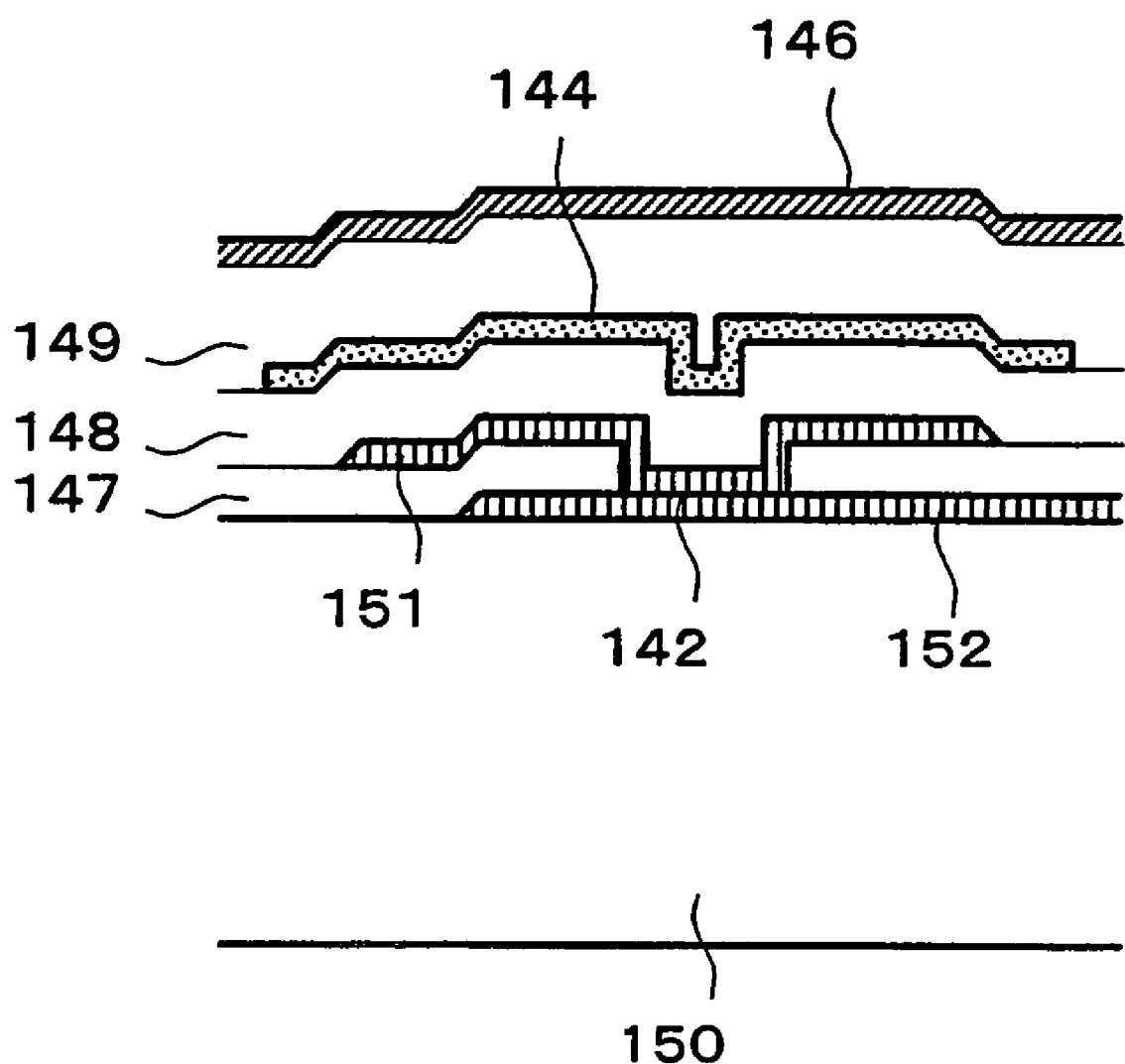

F I G. 3 2
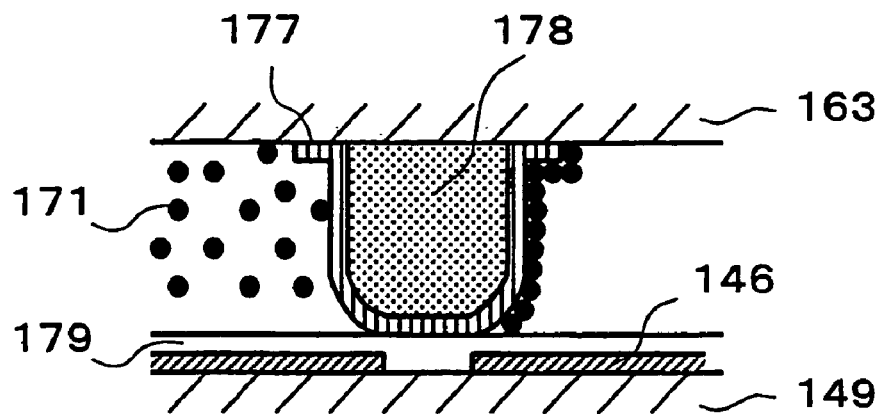
F I G. 3 3
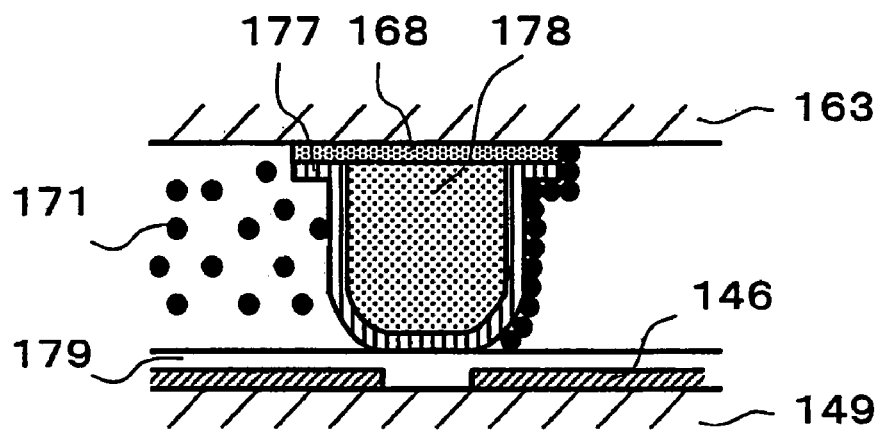
F I G. 3 4
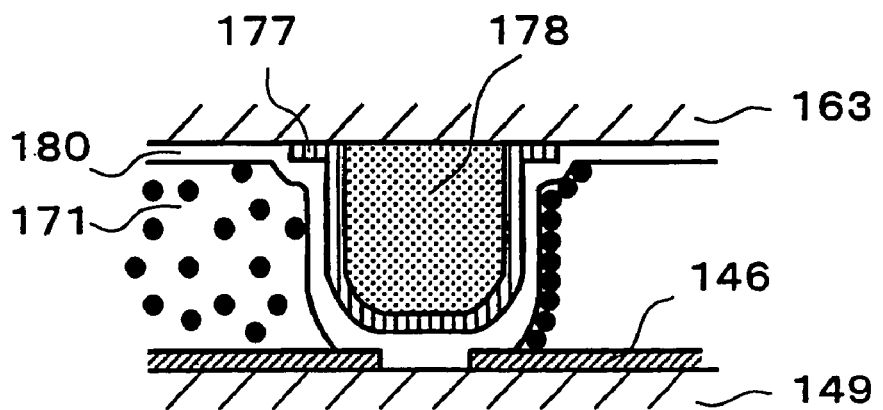

DISPLAY DEVICE, METHOD OF DRIVING THE SAME AND ELECTRIC EQUIPMENT

FIELD OF THE INVENTION

The present invention relates to a display device and a driving method to be use for the display, especially for a low power TFT (Thin Film Transistor) active matrix liquid crystal display, a TFT active matrix electrophoretic display and the driving method to be used for these displays.

Display devices that have similar image presentation performances to the printed papers have been desired in order to present the contents which have been provided by papers. However the resolution of the present display is at most 200 ppi (pixels per inches) and is much less than that of the printed papers.

The displays that have a 200 ppi resolution have a problem of large power consumption in order to drive large number of pixels. The most effective solution to reduce the power consumption is to reduce the frame frequency. There is a technology of built-in memory for the pixel to realize such low power consumption.

For the liquid crystal display devices that have built-in memories, the conventional technology especially for the pixel circuitry, which is relevant to the present invention, have been disclosed by the reference 1 as shown below. As for the conventional electrophoretic display devices, the technology described in the reference 1 has been disclosed. Further electrophoretic display technology that uses an electrically insulating solvent is disclosed by the reference 3. Further electrophoretic display technology that exploits an active matrix drive is disclosed by the reference 4.

Reference 1: Japanese Published Patent, H02-272521, A (1990)
Reference 2: Japanese Published Patent, H09-185087, A (1997)
Reference 3: Japanese Published Patent, H11-202804, A (1999)
Reference 4: Japanese Published Patent, 2002-116734, A (2002)

BRIEF SUMMARY OF THE INVENTION

In order to realize a display device with ultra-high resolution which is similar to the printed papers, it is important to remarkably increase the pixel quantity per unit area of the display. However to realize such the ultra-high resolution display device, it is necessary to increase the clock rate to activate the pixels in large extent, which results in large increase of power consumption.

There is a possible solution to realize a low power high-resolution display in reducing the frame frequency by using a memory built-in each pixel. However, the use, of static RAMs or CMOS memories which utilize more composite transistors than dynamic RAM is hard for high-resolution display since they require large areas and the pixel size is limited by these areas.

In order to make it compatible between the high-resolution display device and the low power consumption display device, a single-kind channel (which implies either N-type or P-type channel) transistor memory can be applied for such built-in memory. The single-kind channel transistor built-in display device is composed with two single-kind channel transistors a pixel.

For the construction using CMOS transistors, it is possible to select one of two referential power lines. Since a single referential power line is used for the construction of a single-kind channel transistor, no proposal has been made to switch a state to the other state without bad effects to image display presentation.

The objective of the present invention is to provide a liquid crystal display device and an electrophoretic display device which have built-in memories composed with single-kind channel transistors to realize a display device that has no bad influences from the decrease of frame frequency in terms of capabilities to refresh image signal memories and update images and performances of high resolution image presentation similar to the printed papers due to the single-kind channel transistor and low power operation due to the decrease of frame frequency.

Since the specific resistivity of the electrophoretic material is lower than that of the liquid crystal material, it is not possible for the active matrix driving method to sufficiently write the drive voltage into the pixels in the general frequency of about 60 Hz which is to update the electrical signals already written in the pixels.

There is a method that is to increase the frame frequency or increase the drive voltage in order to write the necessary drive voltage into the pixel. But this causes the increase of power consumption and becomes unrealistic.

Being different from the liquid crystal display method, the electrophoretic display method has fundamentally a 2-step gradation display and a DC driving display.

An area gradation display, which substantially requires the increase of quantity of the pixels, is necessary to realize the multiple gradation display. It is necessary to consider that the increase of quantity of the pixels causes no increase of power consumption.

The other objective of the present invention is to realize the multiple gradation display device in low power consumption.

BRIEF DESCRIPTION OF THE DRAWINGS

FIG. 14 is a cross sectional drawing of the pixel shown in FIG. 11 and the cut line XIV-XIV shown in FIG. 12.

FIG. 32 is a drawing that shows another embodiment of the structure of the insulation wall 170 and the common electrode 177.

FIG. 33 is a drawing that shows another embodiment of the structure of the insulation wall 170 and the common electrode 177.

FIG. 34 is a drawing that shows another embodiment of the structure of the insulation wall 170 and the common electrode 177.

DETAILED DESCRIPTION OF THE INVENTION

The above technical problems can be solved by means of a method that is to drive a display device which has plural pixels aligned in a matrix form on a substrate, each of which pixels have at least a first transistor, a second transistor, an image signal memory, an electro optic medium and a common electrode and is connected to at least a signal, a scanning signal line and a reference voltage line, wherein a drain or a source and a source or a drain of the first transistor are respectively connected to the image signal line and a gate of the second transistor, a gate of the first transistor is connected the scanning signal line, a drain or a source and a source or drain of the second transistor are respectively connected to the electro optic medium and the reference voltage line and the image signal memory is connected to a drain or a source of the second transistor and the common electrode, by means of scanning the reference voltage line synchronously with the scanning signal line.

Further to the technical solution described above, the technical problem can be solved by the method such that the voltage of the reference voltage line is set to the common voltage synchronously with scanning signal line, voltage of an image signal line is set high voltage level in a constant time during the reference voltage line is in the common voltage for a pixel wherein a node between image signal memory and the second transistor is set a voltage so that the second transistor becomes OFF state and voltage of the image signal line is set high voltage level when the scanning is switched from high voltage level to low voltage level for a pixel wherein a node between image signal memory and the second transistor is set in a voltage so that the second transistor becomes on.

In addition to the above method for solving the technical problem, the technical problem can be solved by the method such that a scanning interval to scan said scanning signal lines and image holding period to hold status of image display by stopping scanning said scanning signal lines are set and said scanning signal line is set in a voltage so that said second transistor is in OFF state during said image holding period.

As have been explaining, for a liquid crystal display device having built-in memories composed with a single-kind channel transistor, the present invention enables to carry out the refreshing the image signal memory and updating the image without bad effects against the image presentation and realize high resolution similar to that of printed papers and low power consumption.

Further advantage of the present invention is that it is possible to realize quickly updating the images of the display device which uses a display method equipped with memory capability of the display by using the display driving method.

The details of the present invention will be described as follows.

FIRST EMBODIMENT

Figure 1:
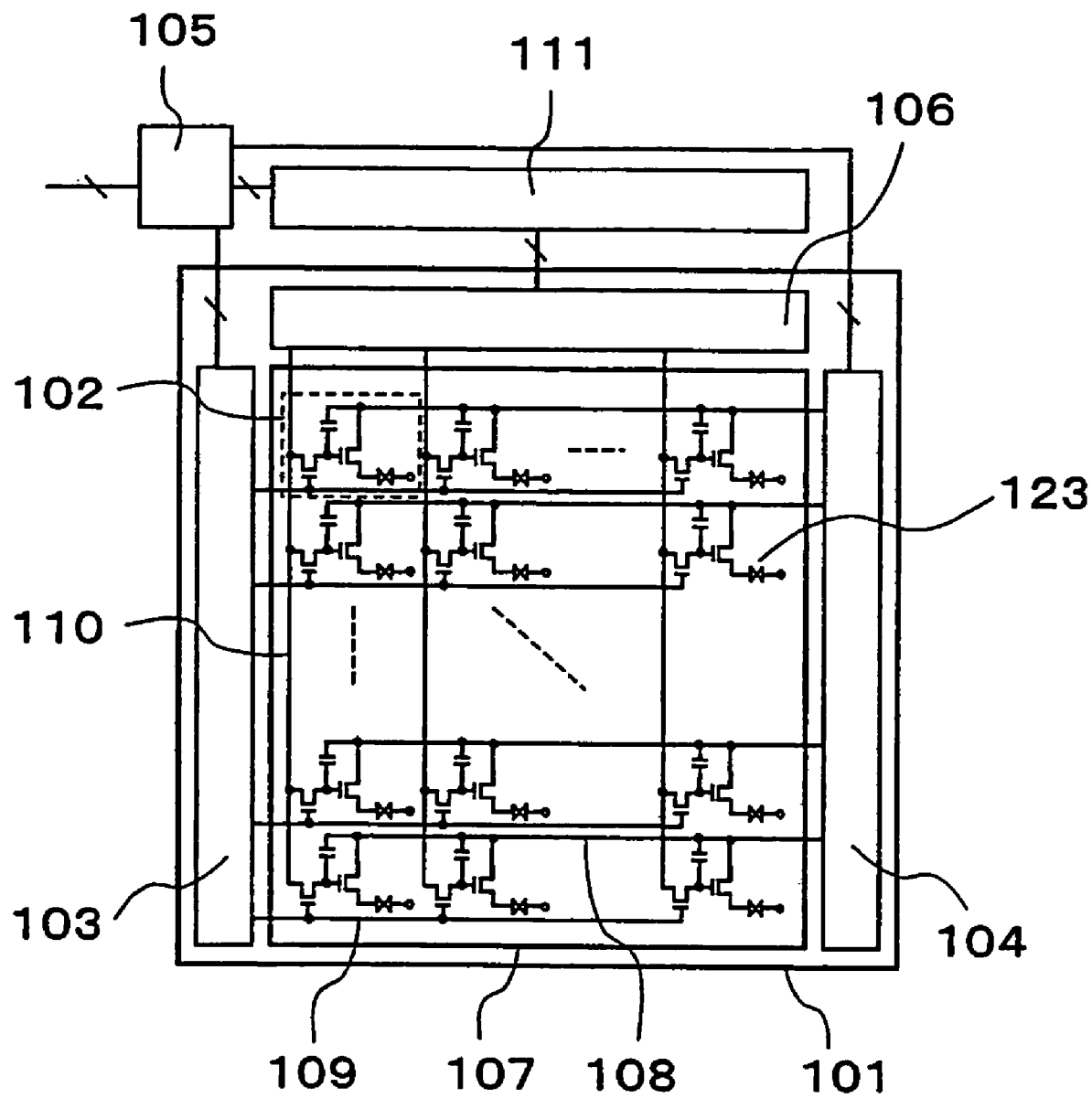
FIG. 1 is a system block diagram of the display device regarding the present invention.

FIG. 1 shows a block diagram of the present invention. The display device regarding the present invention comprises a panel 101 that is an active matrix substrate having plural pixels 102 aligned in a form of a matrix, a scanning line drive circuitry 103 to drive scanning signal lines 109, a reference voltage line drive circuitry 104 to drive the reference voltage lines 108, a timing controller 105, image signal lines 110, selector switches 106 and image signal line drive circuitry 111. The panel 101 has an electro optic medium 123. It is possible to present arbitral images by controlling the light intensity of each pixel by means of electrical control of each pixel 102 independently.

The timing signal and image signal sent from an apparatus that is equipped with the display device of the present invention is input to the timing controller 105. The timing controller controls the image signal line drive circuitry 111, scanning line drive circuitry 103 and the reference voltage line drive circuitry 104.

FIG. 1 shows a construction to independently set the scanning signal line drive circuitry 103 and the reference voltage line drive circuitry 104, however it is not absolutely necessary to keep this construction. For example, it is acceptable to set the scanning signal line drive circuit 103 and the reference voltage line drive circuitry 104 can be constructed in a circuitry to commonly function the both circuit operation. The circuit shown in FIG. 1 is configured in such a way that the scanning signal line drive circuitry 103 is placed in the left hand side of the panel 101 and the reference voltage line drive circuitry 104 is placed in the right hand side of the panel 101. But this is only an example, another configuration such that one or both of the scanning signal line drive circuitry 103 and the reference voltage line drive circuitry 104 are divided into two portions placed on both sides of the panel.

The selector switch 106 is constructed in the case when the adjacent image signal lines 110 have short separation distance to accommodate each output drive circuit of the image signal line drive circuitry 111 for each connection to each image signal line 110 in a manner of one-to-one correspondence. The selector switch is built between the image signal line drive circuitry 111 and the image signal line 110 and has a function to provide the signal from the image signal line drive circuitry 111 to the image signal line 110 in a manager of time-sharing. However if it is possible to connect the image signal line drive circuitry 111 to each image signal line 110 in a one-to-one correspondence, it is not absolutely necessary to construct the selector switch 106. The control circuitry as the image signal line drive circuitry 111, the timing controller 105 etc. may be formed on the panel 101 in a co-planer structure but they are separately formed in an example as shown in FIG. 1.

Figure 2:
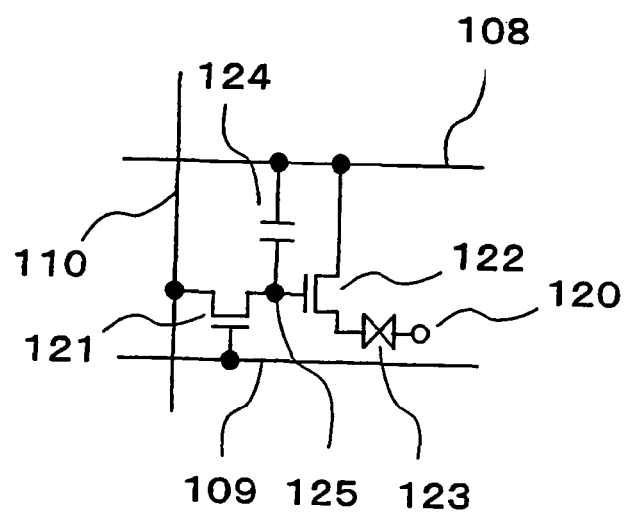
FIG. 2 is a circuit diagram of the pixel 102 shown in FIG. 1.

FIG. 2 shows the circuitry of the pixel 102. The first transistor 121 is connected to the scanning signal line 109 at the gate, either one of the drain and the source is connected to the image signal 110 and the other of the drain and the source is connected to the image signal memory 124 and the gate of the second transistor 122 of which either one of the drain and the source is connected to the reference voltage line 108 and the other of the drain and the source is connected to an electro optic medium 123. The terminal of the electro optic medium 123 other than the connection with the second transistor is connected to the common electrode 120. According to the kind of electro optic medium 123, the common electrode 120 is made on the same substrate regarding to the TFT (Thin Film Transistor), one side or both sides of the substrate.

The transistor used in the embodiment of the present invention is a thin film transistor. For such a TFT, an amorphous silicon TFT or poly-silicon TFT can be used. An organic TFT using an organic semiconductor can be used in accordance with the optimum selection of the material for whole panel fabrication process.

An example to use liquid crystal for the electro optic medium 123, called liquid crystal display method, is explained as follows. As a concrete liquid crystal display method, there are several methods as reflective twist nematic method, cholesteric liquid crystal display method, guest-host liquid, reflective homeotropic ECB (Electrically Controlled Birefringence). In addition, reflective in-plane switching method is applicable, where the common electrode 120 is built on the same substrate.

Figure 3:
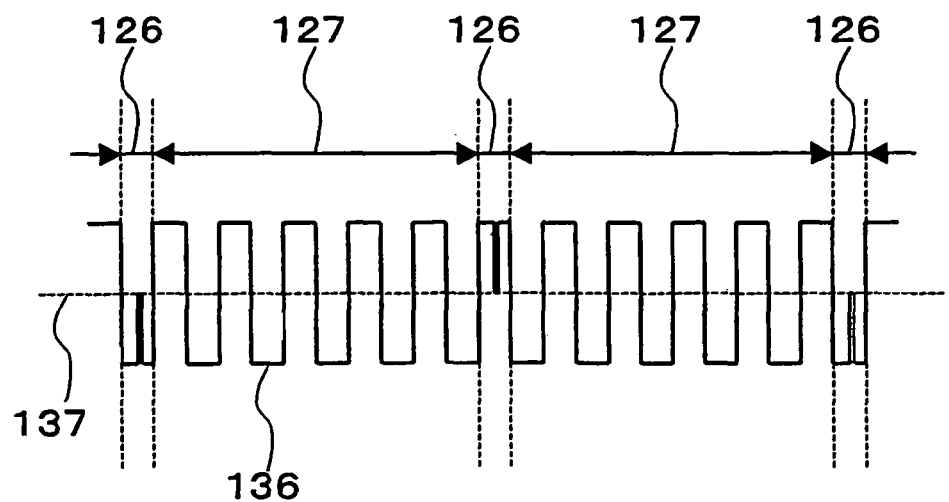
FIG. 3 is a drawing that shows the first example of a driving waveform in the reference voltage line 108 regarding the i-th row.
Figure 7:
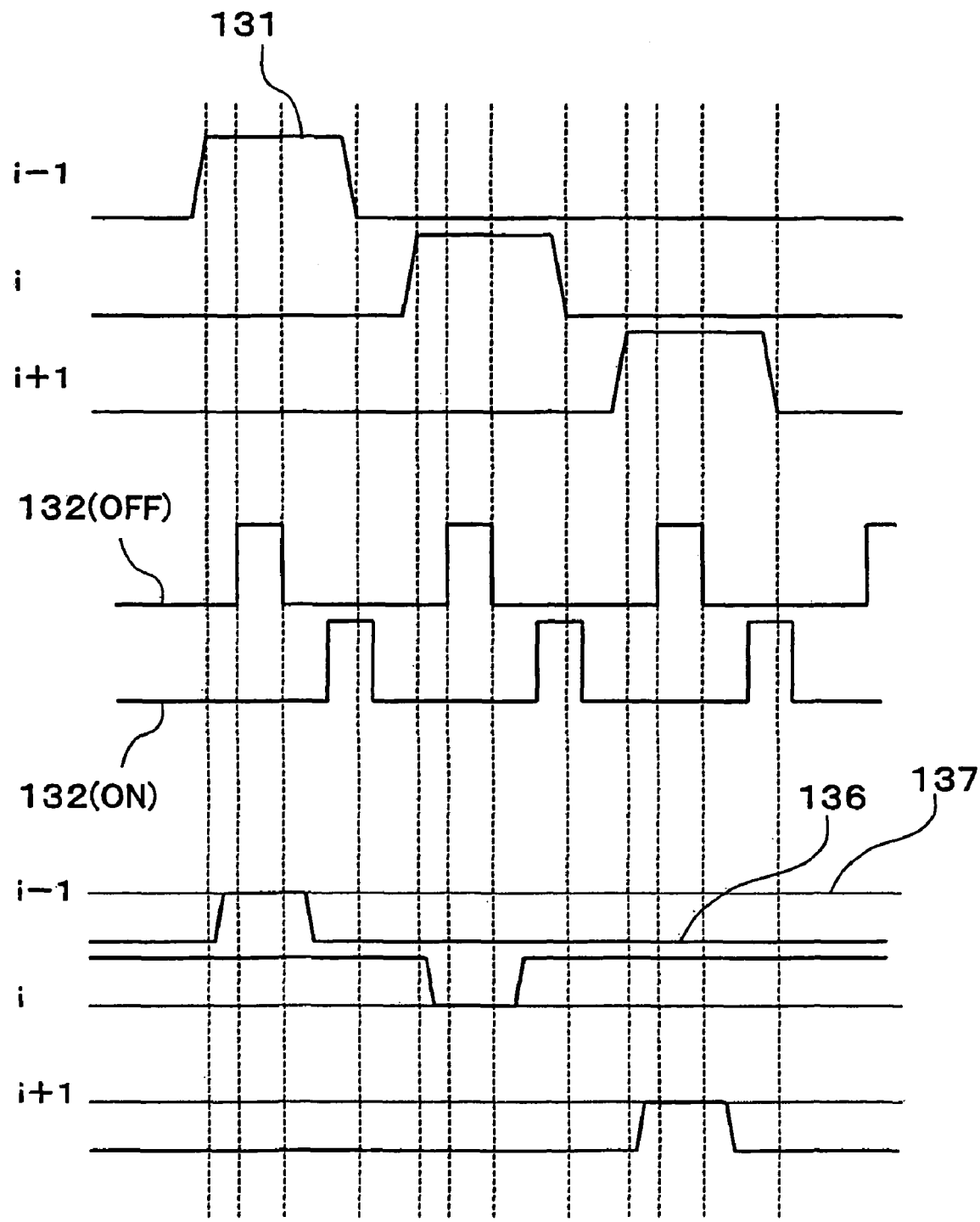
FIG. 7 is a drawing that shows the-second example of a driving sequence in the scanning interval 126.

The driving method regarding the present invention is explained using FIG. 3 and FIG. 7. An example of the driving waveform (voltage) 136 of the i-th row of the reference voltage line 108 is shown.

The driving waveform (voltage) 136 of the reference voltage line 108 can be divided into a scanning interval 126 and the image holding interval 127. The scanning interval 126 consists of the time necessary for refreshing the image signal memory 124 and the time necessary for updating the status of the voltage applied to the electro optic medium 123, that is, the interval of updating the displayed image. The image holding interval 127 is an interval to cease the scanning of display and holds the status of display in accordance with the status of the image signal memory 124 regarding each the pixel.

The driving waveform (voltage) 136 of the reference voltage line 108 is fundamentally an alternative rectangular waveform which changes polarity in a constant term and sets the corresponding scanning signal line 109 to be in the voltage of the common voltage (or the common potential) 137 at the time of scanning for only the scanning interval 126. The relation of the alternation period of the driving waveform (voltage) 136 of the reference voltage line 108 and the duration of the scanning interval 126 is arbitrary.

Figure 4:
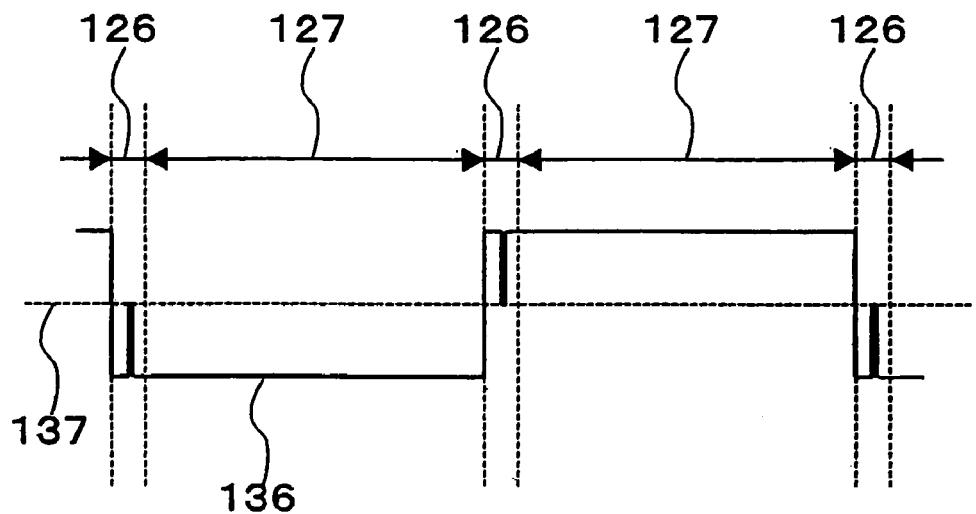
FIG. 4 is a drawing that shows the second example of a driving waveform in the reference voltage line 108 regarding the i-th row.
Figure 5:
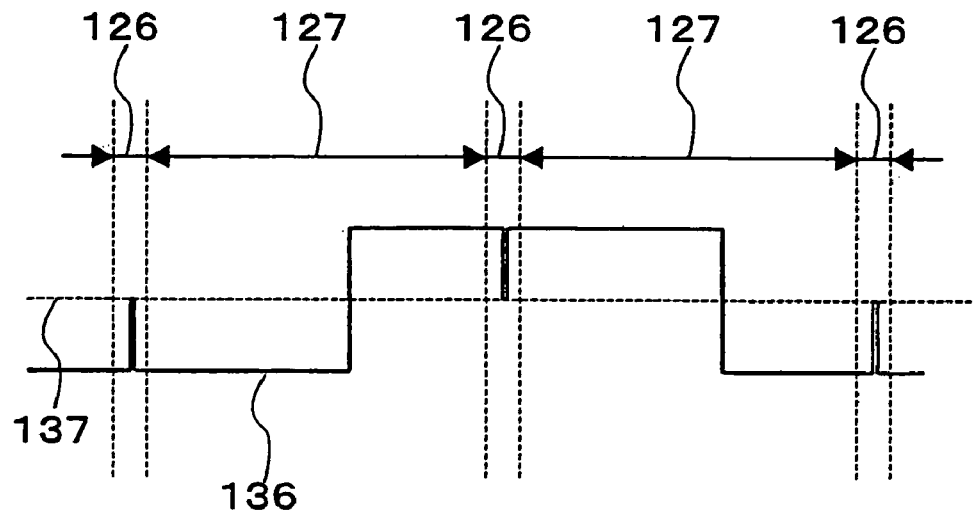
FIG. 5 is a drawing that shows the third example of a driving waveform in the reference voltage line 108 regarding the i-th row.

As shown in FIG. 4, the alternation period of the driving waveform (voltage) 136 of the reference voltage line 108 may be same as the period of the scanning interval 126. Although it is not shown in the figures, the alternation period may be longer than the period to set the scanning interval 126. The timing of the switching is synchronous with the scanning interval 126 in FIG. 3, the synchronization is not absolutely necessary. FIG. 5 shows the corresponding status. The corresponding scanning voltage line 109 can be switched to change the polarity before and after when the voltage of the reference voltage line 108 is set to the common voltage 137 for a constant term.

Figure 6:
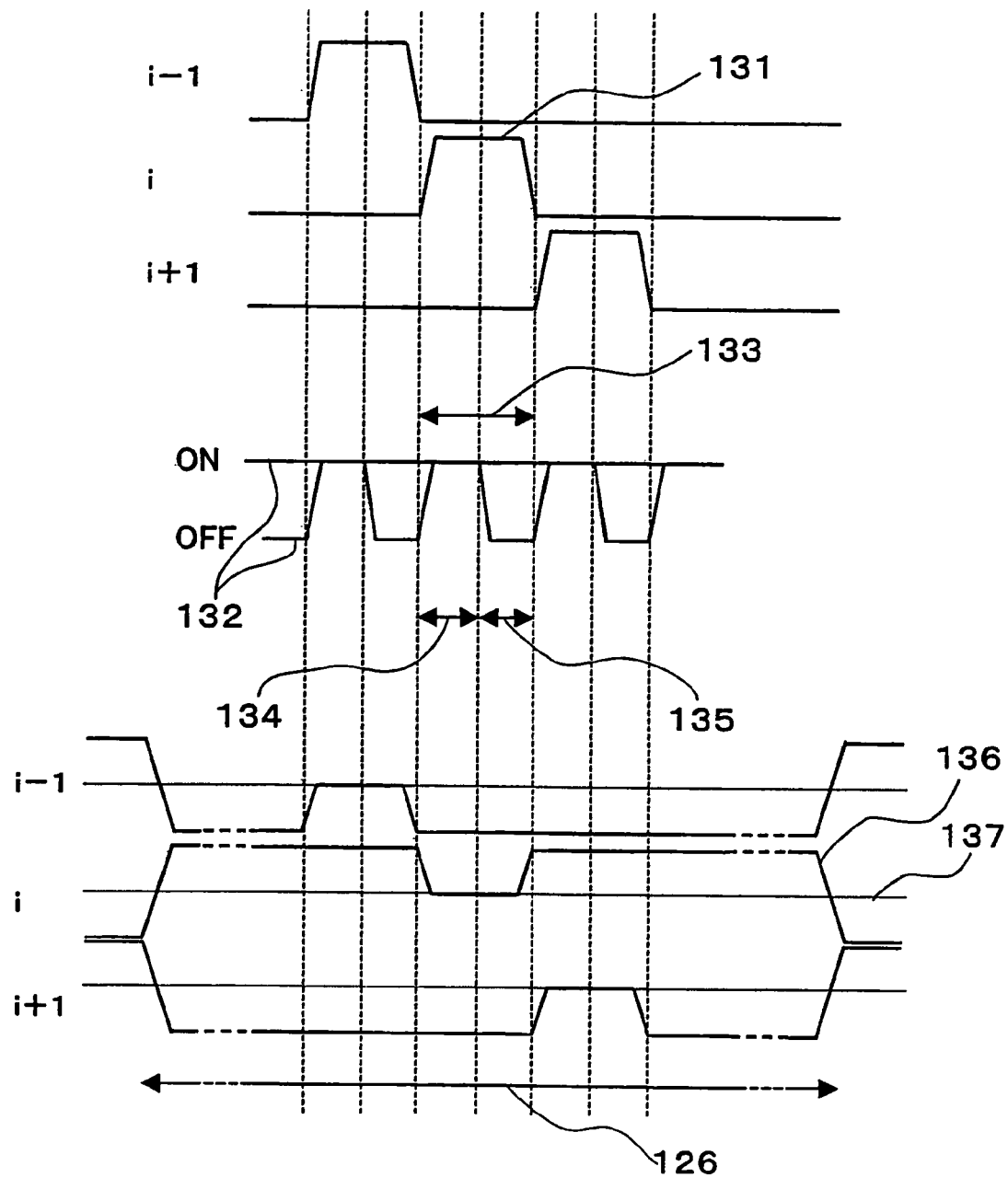
FIG. 6 is a drawing that shows the first example of a driving sequence in the scanning interval 126.

FIG. 6 shows the refresh of the image signal memory 124 and updating of the status of the voltage which is applied to the electro optic medium 123, in other words, the drive sequence of each scanning interval 126 when the display pixel is updated. An example of the gate voltage that select the (i−1)-th, the i-th and the (i+1)-th rows of each scanning voltage lines 109, the driving waveform 132 of the scanning signal line 109 and the driving waveform (voltage) 136 of the (i−1)-th, the i-th and the (i+1)-th rows of the reference voltage lines 108 are shown.

The image signal line 110 is controlled in response of each gate pulse signal 131. The selection term 133 of the i-th scanning signal line 109 is divided into two stages; a reset term 134 for the first term and an image signal writing period 135 following thereof.

The voltage 132 of the image signal line 110 for the reset term 134 is the voltage that sets the second transistor to be ON state. The voltage 132 of the image signal line 110 for the image signal writing period 135 is written to the image signal memory 124 in accordance to the either ON voltage or OFF voltage depending on the voltage that sets the second transistor to be ON state or OFF state.

The driving waveform (voltage) 136 of the reference voltage line 108 corresponding to each scanning signal line 109 has alternatively a reverse polarity for every scanning lines against the common voltage 137 and has a so-called alternative reverse drive. The driving wave form (voltage) 136 of each scanning signal line 109 is set to be the common voltage 137 synchronously with gate pulse signal 131.

The first transistor 121 connected to the corresponding scanning signal line 109 is ON state by the gate pulse signal 131. Since the voltage of the image signal line 110 sets the second transistor 122 for the reset term 134, the second transistor 122 is kept to be ON state regardless to the status of the image signal memory 124 for the time being and the resistivity between the reference voltage line 108 and electro optic medium 123 is in the status of low resistance.

Since the voltage of the reference voltage line 108 is same as the common voltage 137, the both terminals of the electro optic medium 123 are substantially in the same voltages. In other words, the voltage difference between the both terminals of the electro optic medium 123 is substantially reset to be 0 V.

After then, the image signal voltage in the driving waveform 132 of the scanning signal line 109 is written into the image signal memory 124 in an image signal writing period 135. The ON state and OFF state of the second transistor 122 are controlled in response to the status of the image signal memory 124.

In an image signal writing period 135, the resistivity between the reference voltage line 108 and the electro optic medium 123 is low when the voltage of the node 125 of the image signal memory 124 is in the voltage that sets the ON state of the second transistor 122, that is, when the driving waveform 132 of the image signal line 110 is ON state The voltage difference between the reference voltage line 108 and the common electrode 120 is kept to be applied to the electro optic medium 123 even after the first transistor 121 becomes OFF after the image signal writing period corresponding to the scanning signal line 109

On the other hand, in an image signal writing period 135, the resistivity between the reference voltage line 108 and the electro optic medium 123 is high when the voltage of the node 125 of the image signal memory 124 is in the voltage that sets the OFF state of the second transistor 122, that is, when the driving waveform 132 of the image signal line 110 is OFF and then the electro optic medium 123 becomes electrically floating status. Since the second transistor 122 becomes OFF state while the voltage of the reference voltage line 108 is same as the common voltage 137, the voltage difference of the two terminals of the electro optic medium 123 is maintained substantially to be 0 volt.

In the drive sequence as described above, the refresh of the image signal memory 124 and the updating of the applied voltage to the electro optic medium 123 that is the updating of the displayed image.

FIG. 7 shows the refresh of the image signal memory 124 and the updating of the applied voltage to the electro optic medium 123, that is, the second embodiment of the drive sequence regarding the updating of the displayed image in each scanning interval 126, where the examples of the driving waveform (voltage) 136 of the (i−1)-th, the i-th and the (i+1)-th rows of the reverence voltage lines are shown.

The driving waveform 132 of the image signal line 110 has different forms for the cases when the voltage difference between both terminals of the electro optic medium 123 is substantially set 0 volt and when it is the voltage difference between the voltage 135 of the reference voltage line 108 and common voltage 137.

FIG. 7 shows the driving waveform (OFF) of the image signal line 110 for the case when the voltage difference between both terminals of the electro optic medium 123 is substantially set 0 volt. The driving waveform 132 (ON) of the image signal line 110 shows the driving waveform of the scanning signal line 109 for the case when the voltage difference between both terminals of the electro optic medium 123 is set to be the difference of voltages the voltage 136 of the reference voltage line 108 and the common voltage 137. The wave form 132 of the image signal line 110 is sampled at the falling time of the gate pulse signal 131 and is written into the image signal memory 124. In other words, the low voltage level for the driving waveform 132 (OFF) and the high voltage level for the driving waveform 132 (ON) are memorized.

The drive save form 132 of the image signal line 110 as shown in FIG. 7 show the wave form which set the all pixel sequentially aligned in a column direction OFF state or ON state. However, the actual wave form is an alternatively changing form of OFF state and ON state in response to the image signal.

In the driving sequence shown in FIG. 6, the voltage difference between the both terminals of the electro optic medium 123 was substantially 0 V in the reset interval 134 even in the case that the node 125 of the image signal memory 124 was in the voltage to set the second transistor 122 in an ON state in the previous scanning interval and is kept in the same voltage in the present scanning interval. Since the electro optic medium 123 does not respond to the voltage such that the voltage difference between the both terminals of the electro optic medium 123 is substantially 0 V in the reset interval 134 at longest if the response time of the electro optic medium 123 is sufficiently longer than the reset interval 134, no affects against the image display is made. But if the response time of the electro optic medium 123 is similar to the reset interval 134, the affects against the image display is made. For example, a bad affect as a flicker is possibly made.

On the other hand, in the driving sequence as shown in FIG. 7, it is possible that only the pixel of which both terminals of the electro optic medium 123 is substantially set to be 0V sets the second transistor 122 ON state during the time when the first transistor 121 is selected and the driving waveform 136 of the reference voltage line 108 is controlled in a voltage of the common voltage 137.

According to the driving sequence as shown in FIG. 7, it is possible to carry out the refresh of the image signal memory 124, the reset that the both terminals of the electro optic medium 123 of the pixel which is in a floating status are substantially set to be 0V and the updating the image display at the same time without bad affect against the image display even when the response time of the electrical optical medium 123 is similar to the reset interval 134.

Figure 8:
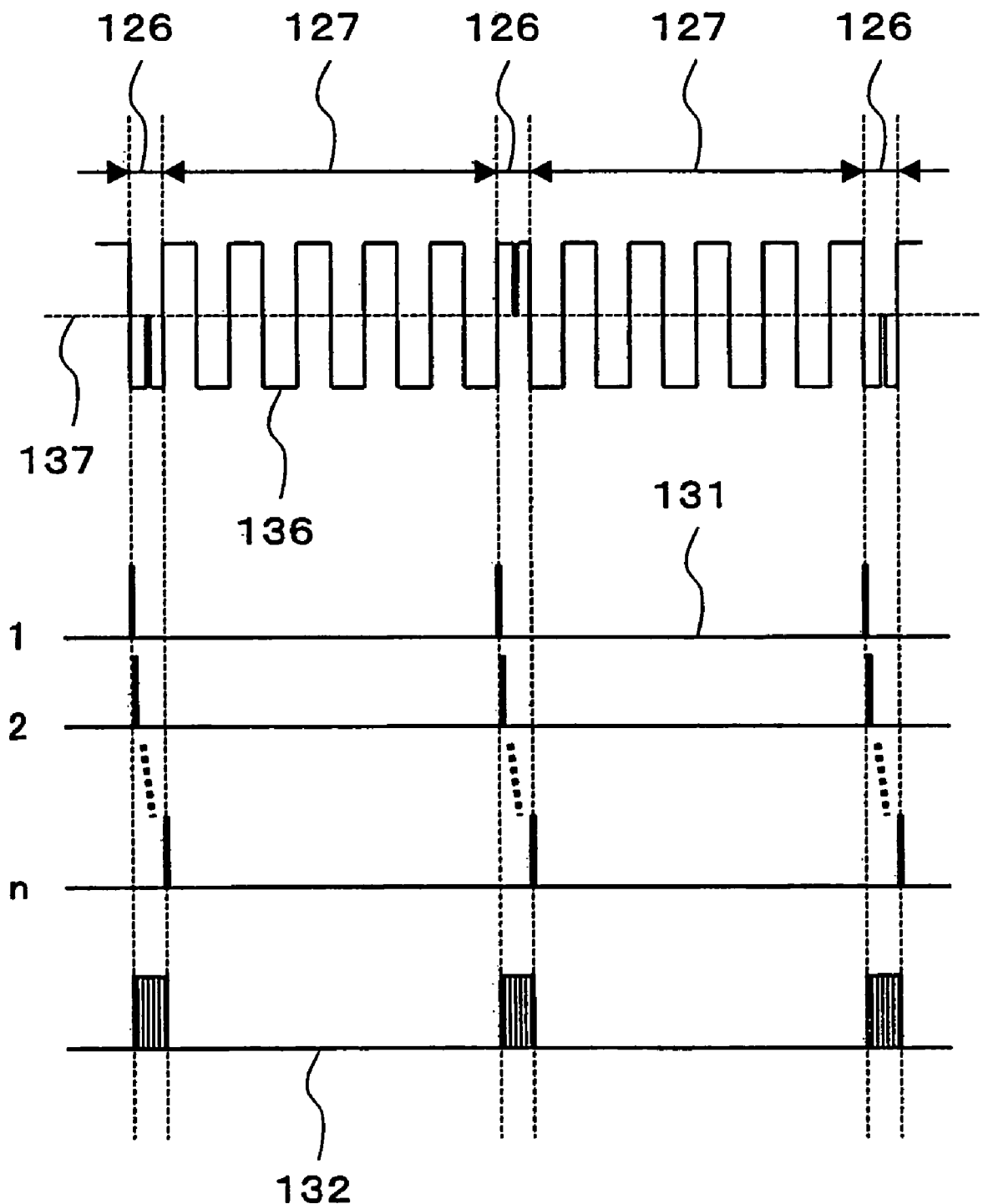
FIG. 8 is a drawing that shows a driving sequence of the reference voltage line 108, the scanning signal line 109, the image signal line 110.

The driving sequence of the image signal line 110 in the image holding interval 127 is explained by using FIG. 8 which shows the driving sequences of the reference voltage line 108, the scanning signal line 109 and the image signal line 110.

For the purpose of the low frequency driving, it is necessary to take the OFF resistance of the first transistor 121 and the second transistor 122 into account. The OFF resistance hereby implies the electrical resistance between the source and the drain of the transistor of which gate voltage is controlled so that the electrical resistance is kept in high resistance. The OFF resistance is important to hold the status of the image signal memory 124.

When the OFF resistance of the first transistor 121 is low, the image signal memory 124 changes by the influence of the voltage of the image signal line 110. There is a risk of fluctuation of the light intensity due to the variance of the voltage difference of the both terminals of the electro optic medium 123 when the resistance between the source and the drain of the second transistor 122 by the change of the status of the image signal memory 124.

If the voltage of the image signal memory 124 which is in OFF state is not maintained, the floating status is not hold due to varying of the resistance of the second transistor 122 and the voltage of the electro optic medium 123 at the terminal to the connection with the second transistor 122 fluctuates due to the voltage fluctuation of the reference voltage line 108 so that the voltage difference between the both terminals of the electro optic medium 123 cannot be maintained to be 0V. As the result, unexpected fluctuation of the image display in the light intensity and degradation of the picture quality is made. The variation of the light intensity status advances with time and is reset in a preferable status at the refresh time of image signal memory 124. Therefore, a flicker synchronous with refresh period of the image signal memory 124 is made.

It is possible to control the voltage status of the image signal memory 124 by setting the voltage 132 of the image signal line 110 in the image holding interval 127. By setting the constant voltage as described before substantially similar to the voltage of the signal voltage (OFF voltage) that sets the second transistor OFF, the voltage of the node 125 of the image signal memory 124 which is in OFF state does not vary and the OFF state of the second transistor 122 is hold.

Alternatively, it is preferred to take the driving sequence such that the image signal line 110 is set floating after setting the constant voltage as described before substantially similar to the voltage of the signal voltage (OFF voltage) that sets the second transistor OFF, even for the case that the voltage of the image signal line 110 is set floating in the image holding interval 127.

The OFF resistance of the second transistor is important to maintain the voltage difference between the both terminals of the electro optic medium 123. When the OFF resistance of the second transistor 122 is low, the voltage at the connecting node of the electro optic medium 123 and the second transistor 122 varies in time by the influence of the voltage of the reference voltage line 108. Therefore, the voltage difference between both terminals of the electrical optical medium 123 varies and an unexpected fluctuation of the light intensity is-made as visually recognized such as a flicker.

The voltage of the electro optic medium 123 at the side of the second transistor 122 is determined so that the difference of the voltage of the reference voltage line 108 and the common electrode voltage 120 is determined by the partial voltage given by the OFF resistance of the second transistor 122 and the resistance of the electro optic medium 123. Therefore, it is preferred that the resistance of the electrical optical medium 123 which is between the common electrode 120 and the pixel electrode (reflection electrode) which is connected to the second transistor 122 is lower than the OFF resistance of the second transistor 122 in order to suppress the varying of the voltage of the electrical optical medium 123 at the side of the second transistor 122.

On the other hand, the voltage of the node 125 at the image signal memory 124 is explained when it sets the second transistor 122 in ON state.

The voltage of the node 125 at the image signal memory 124 which is in the ON voltage approaches to the voltage of the image signal line 110 which is set similar to the OFF voltage. The voltage between the reference voltage line 108 and the common electrode 120 is divided by the second transistor 122 and the electro optic medium 123 and the partial voltage at the second transistor 122 among the voltage difference between the reference voltage line 108 and the common electrode 120 is negligible small as far as the resistance of the second transistor 122 is sufficiently smaller than the resistance of the electro optic medium 123.

For the display device that uses the electro optic medium 123, the voltage drop by the partial voltage of the second transistor 122 as described above does not cause the fluctuation of the light intensity and accepts the driving at 1 Hz or lower frequencies as far as the device construction is suitable for such operation.

Figure 9:
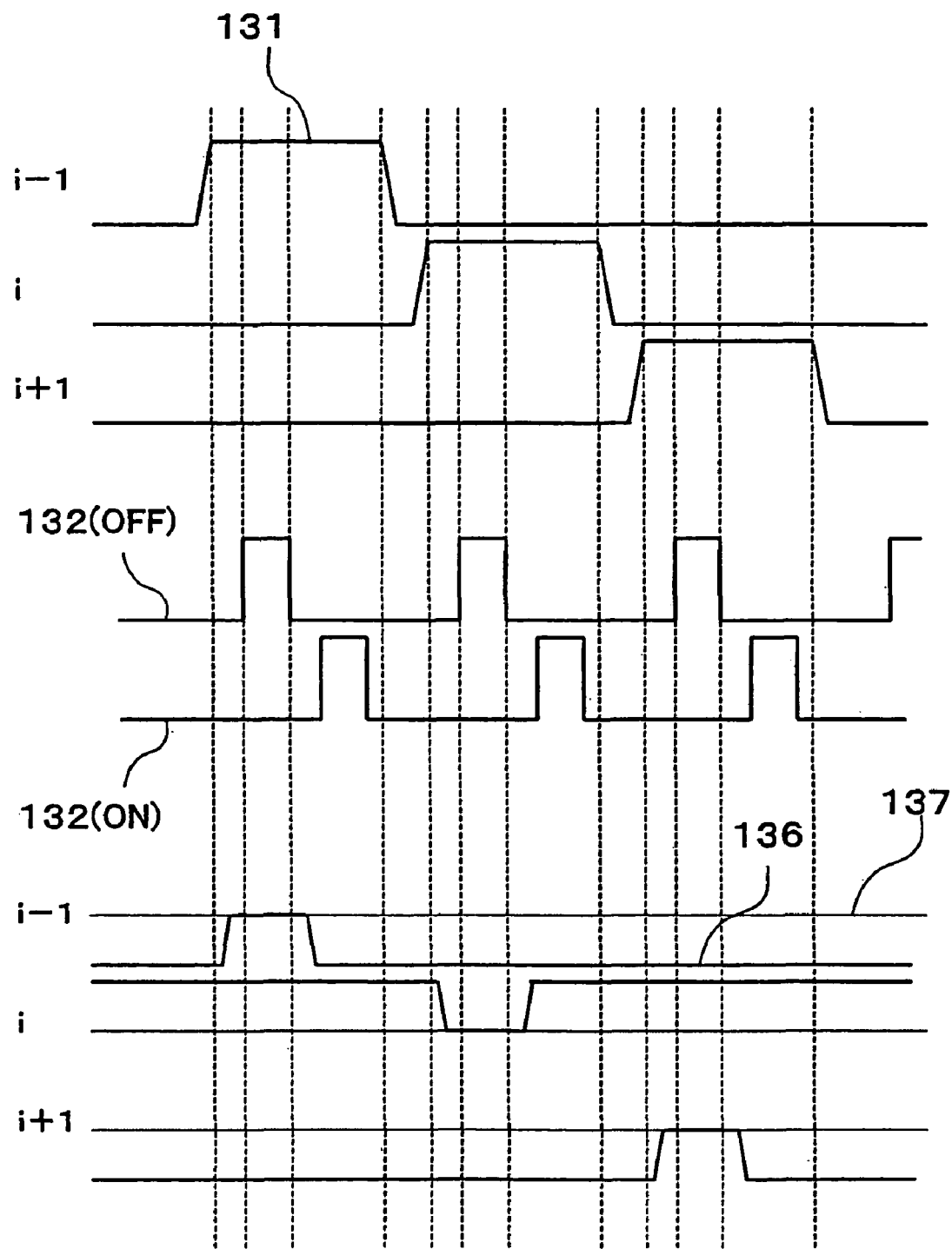
FIG. 9 is a drawing that shows the third example of a driving sequence in the scanning interval 126.
Figure 10:
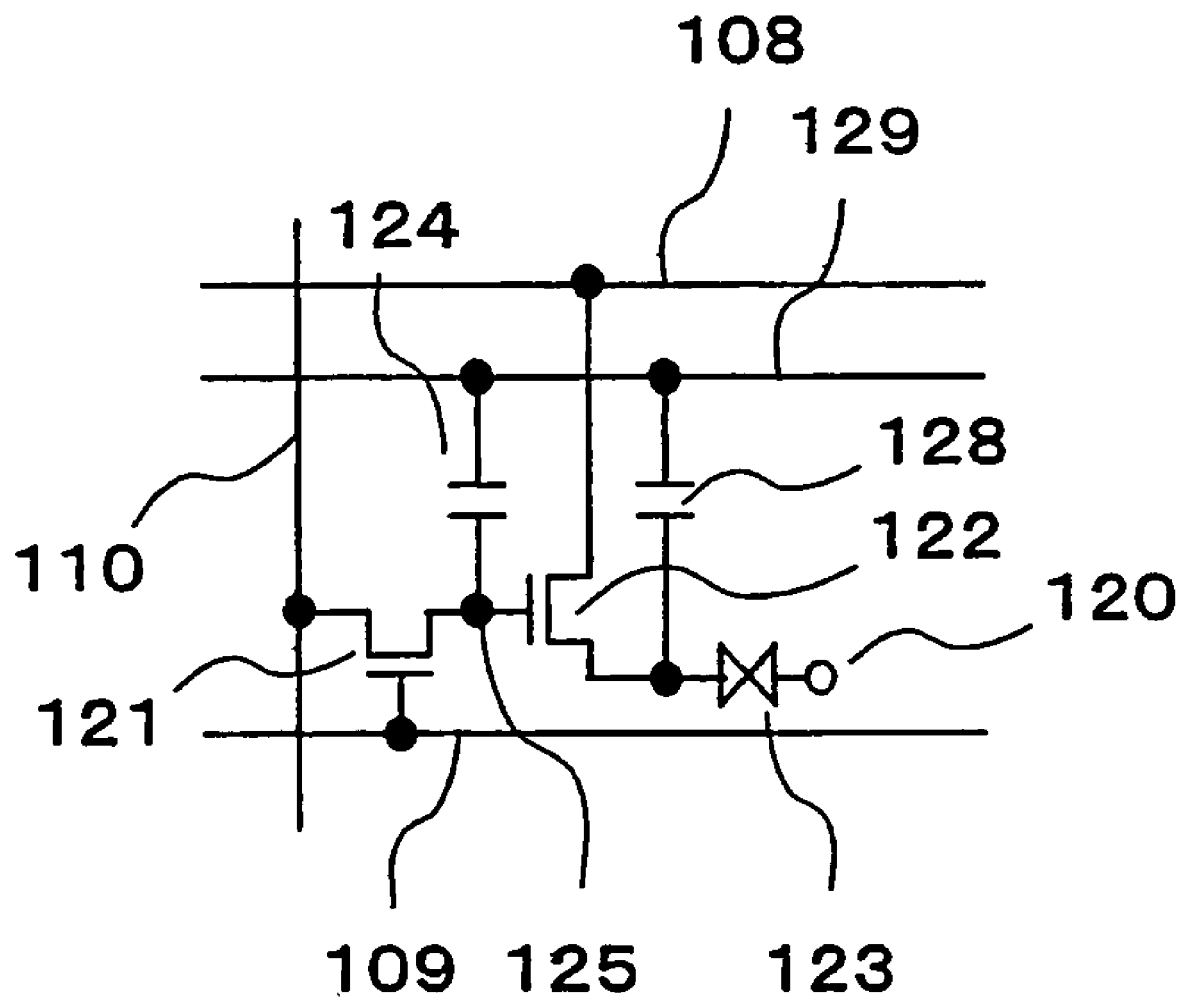
FIG. 10 is an example of a circuit diagram of the pixel 102.

FIG. 9 shows the third embodiment of the driving sequence. The difference of FIG. 9 from FIG. 7 is that the pulse of the driving wave form 132 (ON) falls before the falling of the gate pulse 131 of the corresponding scanning signal line 109. The driving sequence of the driving wave from 132 (OFF) of the image signal line 110 is same as that of FIG. 7.

On the other hand, the driving sequence of the driving waveform 132 (ON) of the image signal line 110 is as follows. The first transistor 121 is in ON state when the gate pulse 131 of a certain scanning signal line 109 rises and the second transistor 122 is further in ON state when the driving waveform 132 (ON) in the image signal line 110 rises. At this time, the voltage 136 of the reference voltage line 108 is in a positive voltage or a negative voltage and the voltage between the common voltage 137 and the positive voltage or the negative voltage is applied to the electro optic medium 123.

After then, the driving waveform 132 (ON) falls and the second transistor 122 is in the OFF state. At this time, the electro optic medium 123 is held in the voltage of the positive voltage of the reference voltage line 108 or the negative voltage 136. In addition, the gate pulse 131 of the scanning signal line 109 falls and the voltage of the node 125 of the image signal memory 124 is sampled to hold the second transistor 122 in OFF state.

By using this driving method, the possible fluctuation of the threshold voltage of the second transistor 122 especially for the case when amorphous silicon TFT is used for the second transistor 122 can be suppressed.

FIG. 9 shows the case when the timing to set the voltage 136 of the reference voltage line 108 the common voltage 137 is set before the gate pulse 131. But the timing of the driving waveform 132 (OFF) of the image signal line 110 can be exchanged with the timing of driving waveform 132 (ON).

For this driving method, the voltage 136 of the reference voltage line 108 is basically arbitrary in the status that the gate pulse 131 rises, for example, the voltage 136 may be floating in the image holding interval 127.

In case when the present driving method is applied, the voltage between the second transistor and the electro optic medium 123 can be stabilized by constructing the common line 129 and a holding capacitor 128 between the common line and the electro optic medium 123 at the side of the second transistor.

The voltage of the node 125 of the image signal memory 124 is the one that holds the second transistor 122 in OFF state. When the image signal memory 124 is constructed between the gate of the second transistor 122 and common line 129, the voltage of the node 125 may be stabilized.

Figure 11:
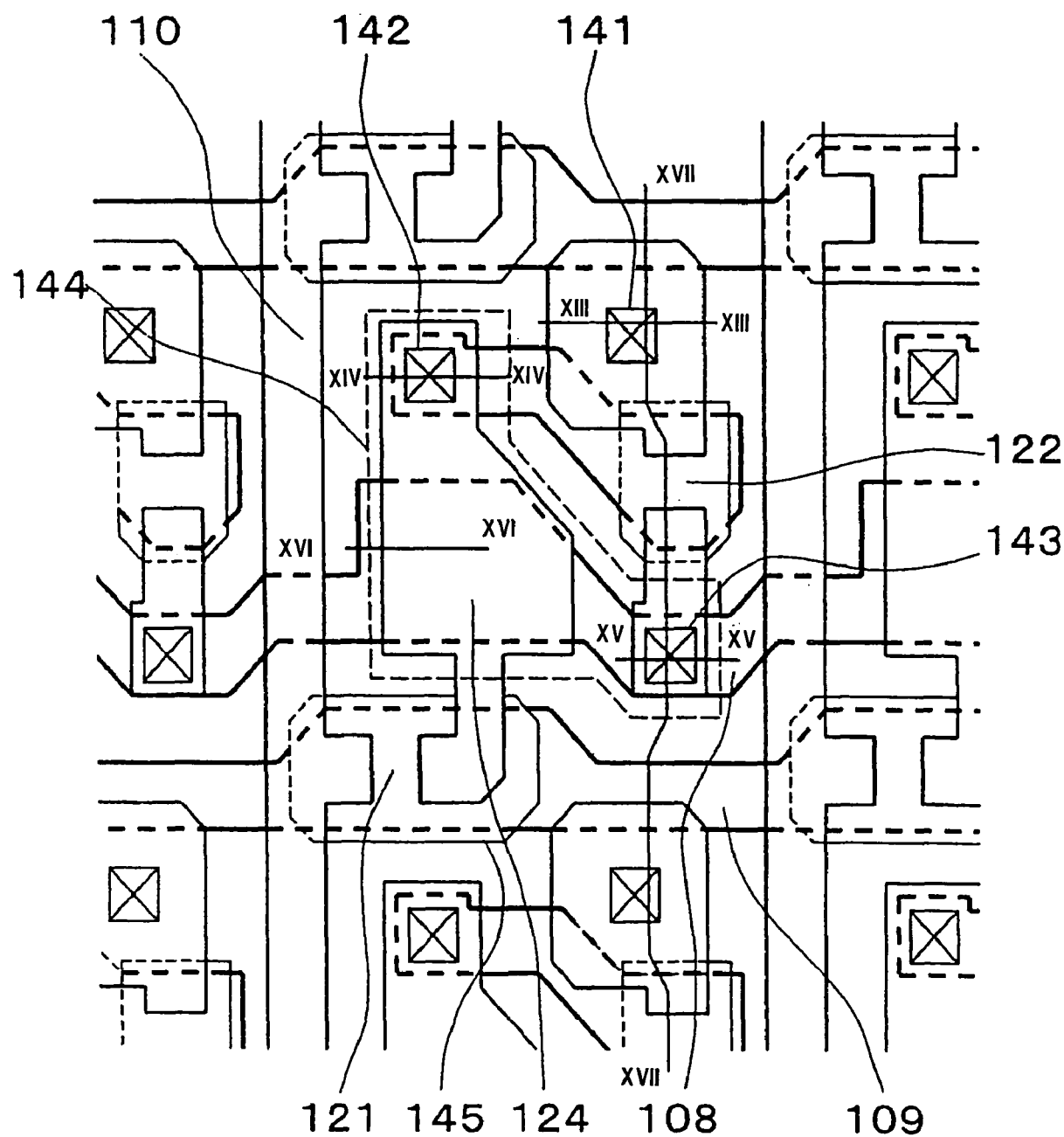
FIG. 11 is a drawing that shows a layout of the pixel underneath the reflective electrode 146.
Figure 12:
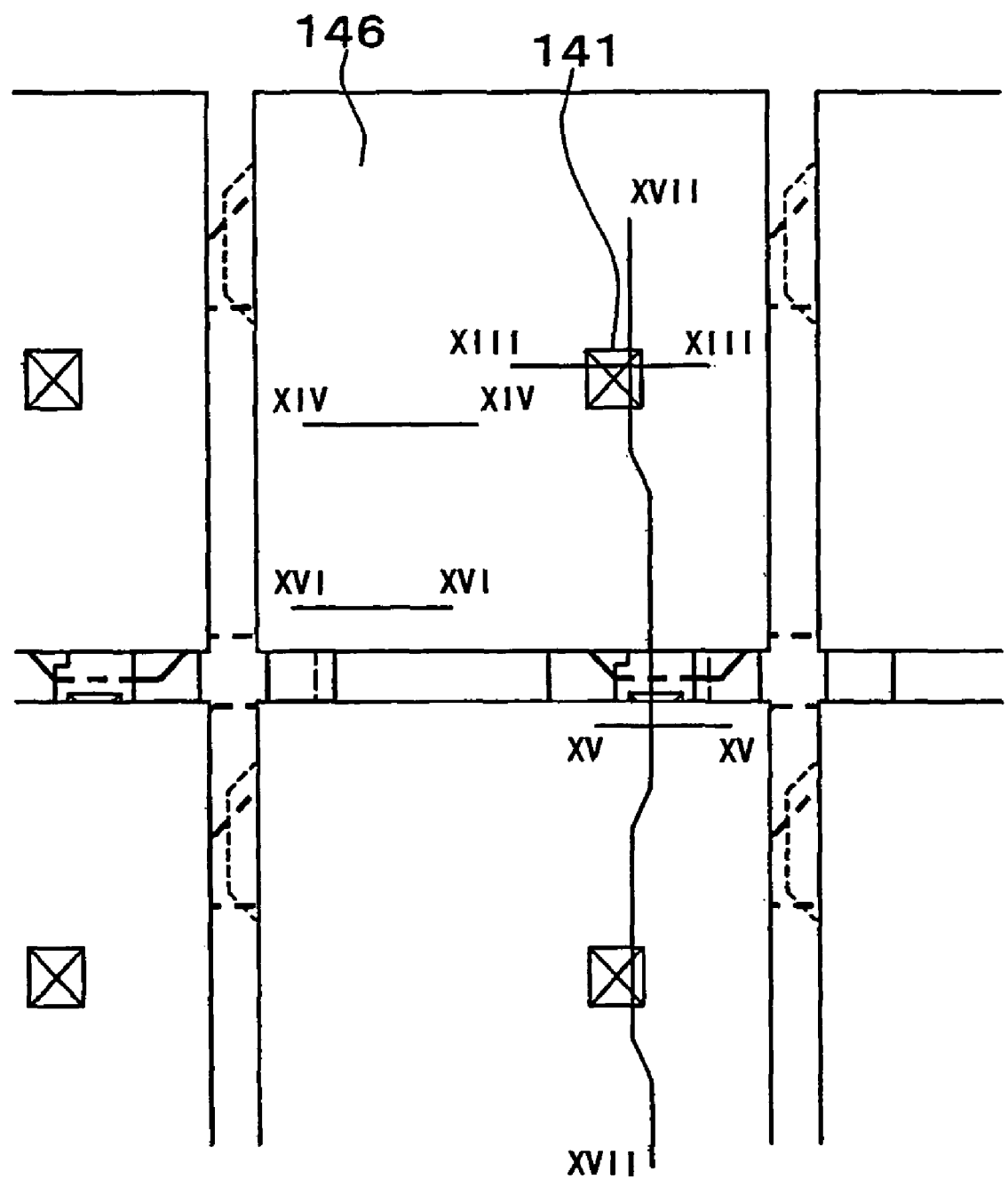
FIG. 12 is a drawing that shows a layout of the pixel including the reflective electrode 146.

FIG. 11 and FIG. 12 shows an example of the layout of pixel 102 adopted to the active matrix regarding the present invention. The pixel 102 has the first transistor 121 which has an amorphous silicon layer at the crossing section between the image signal line 110 and the scanning signal line 109 and the second transistor 122 of which gate is connected to the ground through the image signal memory 124 and a through hole contact 142 at the source electrode which is in the reverse side of the image signal line 110 of the first transistor 121.

The first transistor 121 and the second transistor 122 shown in the present embodiment are amorphous silicon transistors 145 which have an amorphous layer 145 as the semiconductor layer. The source electrode of the first transistor 121 as described before forms an electric capacitor with the electrode 144 which is connected to the reference voltage line 108 and the source or the drain of the second transistor through the through hole contact 143 and the electric capacitor functions as an image signal memory 124. Either the source or the drain of the second transistor 122 is connected to the reference voltage line 108 through the through hole contact 143 and the rest of the source or the drain is connected to the reflective electrode (pixel electrode) of the second transistor 122 through the through holed contact 141 as shown in FIG. 12.

Figure 15:
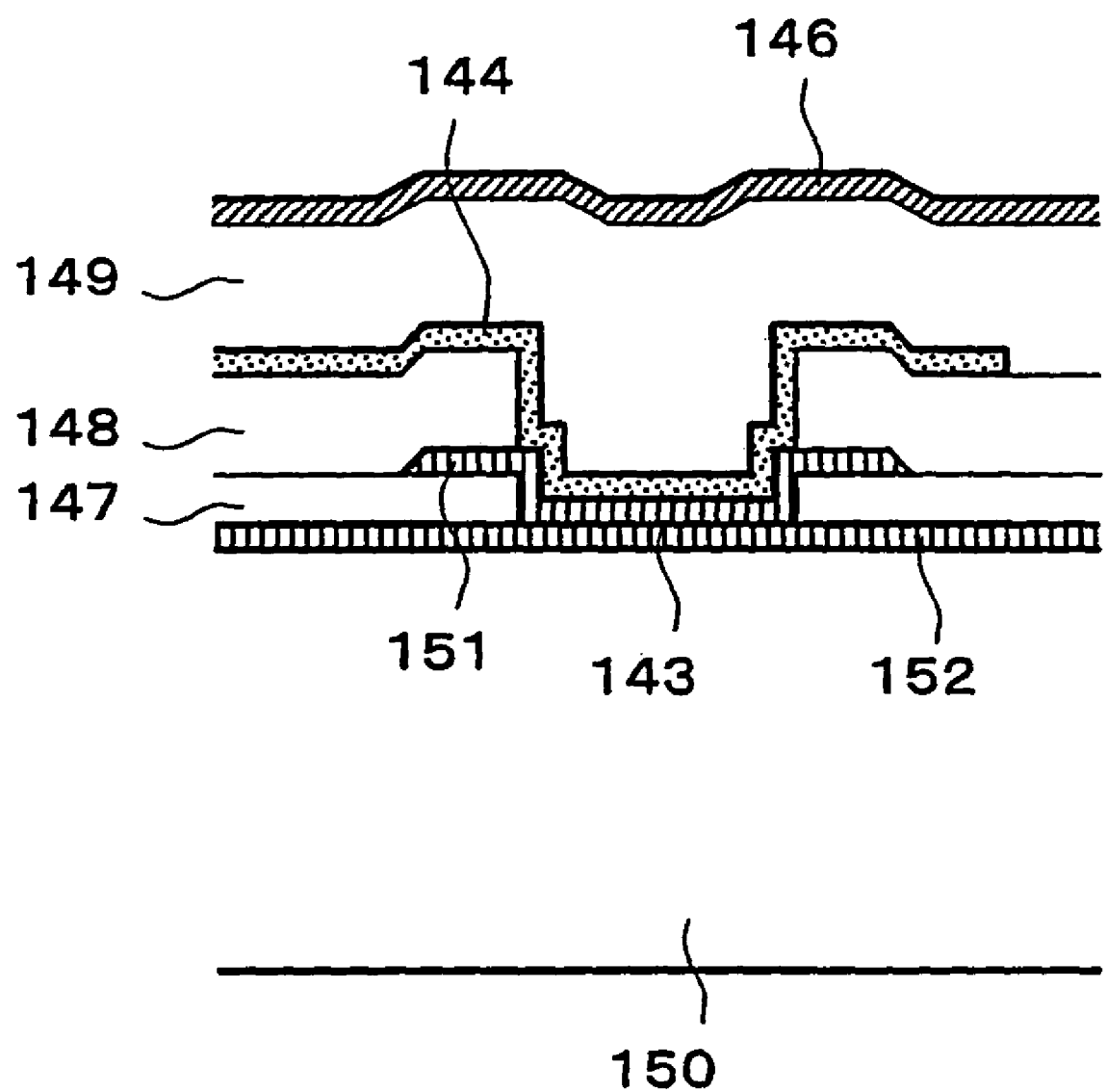
FIG. 15 is a cross sectional drawing of the pixel shown in FIG. 11 and the cut line XV-XV shown in FIG. 12.
Figure 16:
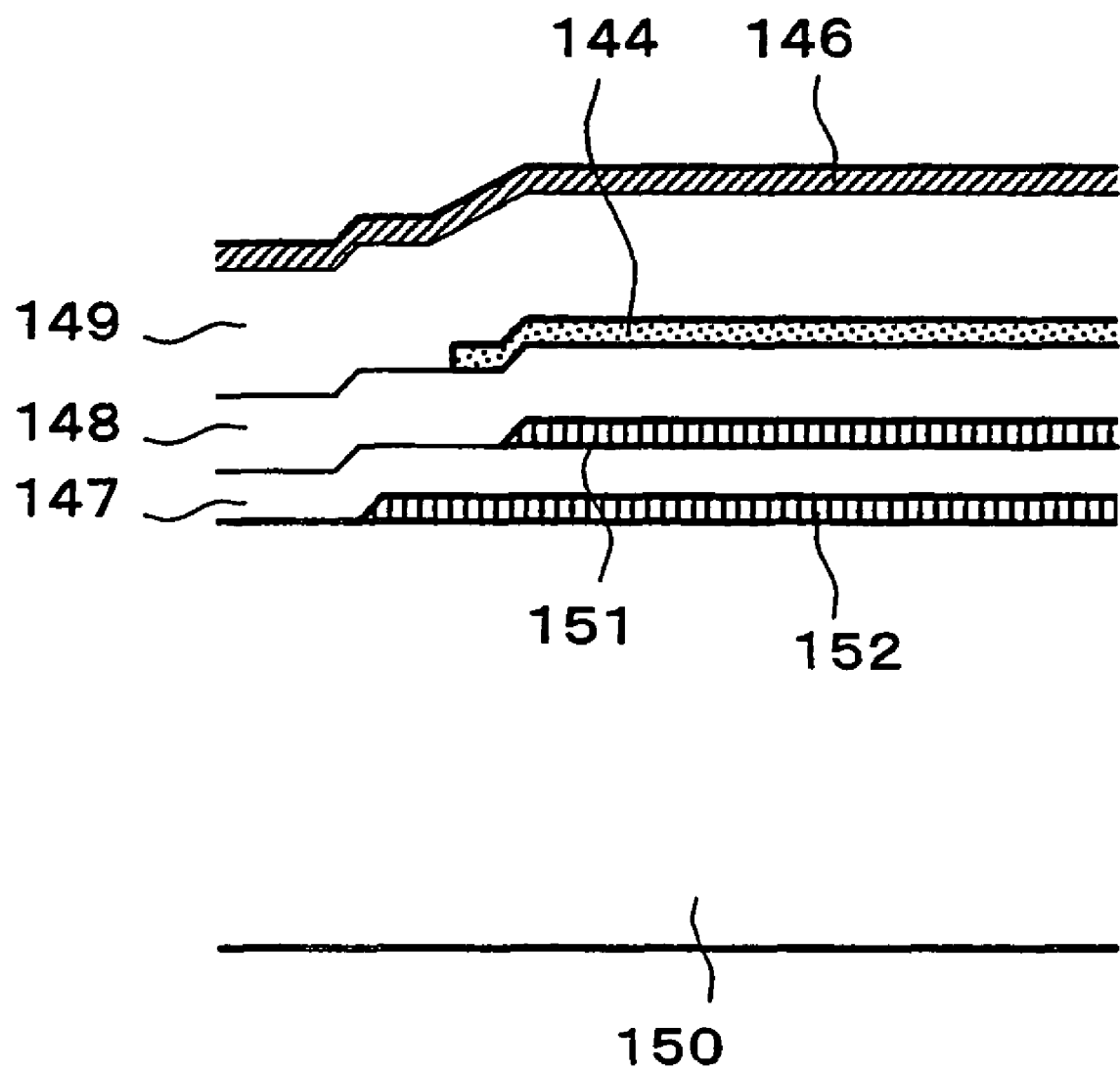
FIG. 16 is a cross sectional drawing of the pixel shown in FIG. 11 and the cut line XVI-XVI shown in FIG. 12.
Figure 17:
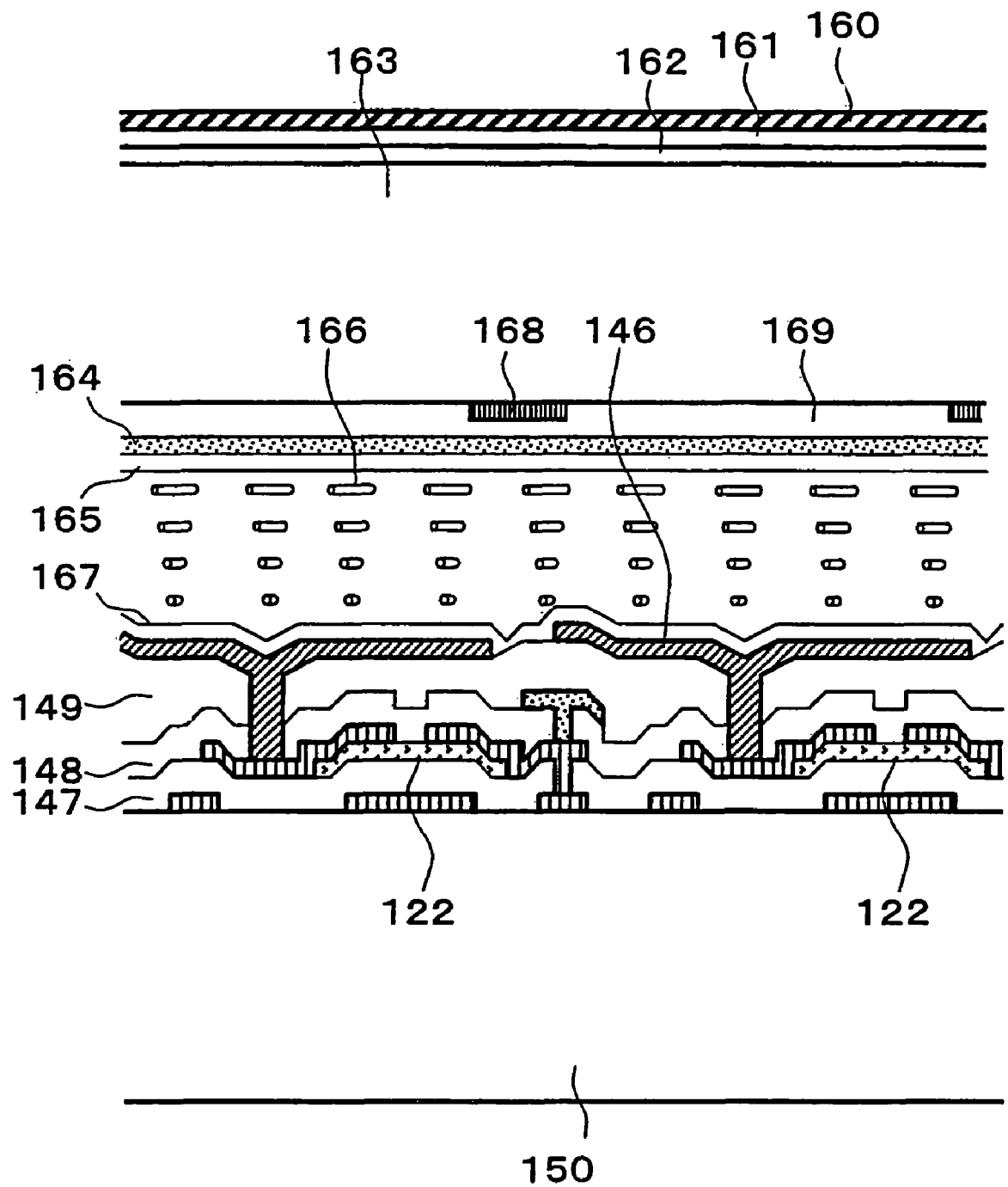
FIG. 17 is a cross sectional drawing of the pixel shown in FIG. 11 and the cut line XVII-XVII shown in FIG. 12.

The cross sectional views as indicated by XIII-XIII, XIV-XIV, XV-XV, XVI-XVI, XVII-XVII are shown in FIG. 13, FIG. 14, FIG. 15, FIG. 16, FIG. 17. FIG. 17 additionally includes the liquid crystal layer 166 and the substrate 163 and the other figures shows the cross sectional view of the substrate 150 at the side of the active matrix. FIG. 14 to FIG. 16 show the four-layered wiring layers 151, 152, 144, 146 with the insulation layers 147, 148 and 149 in-between.

Figure 13:
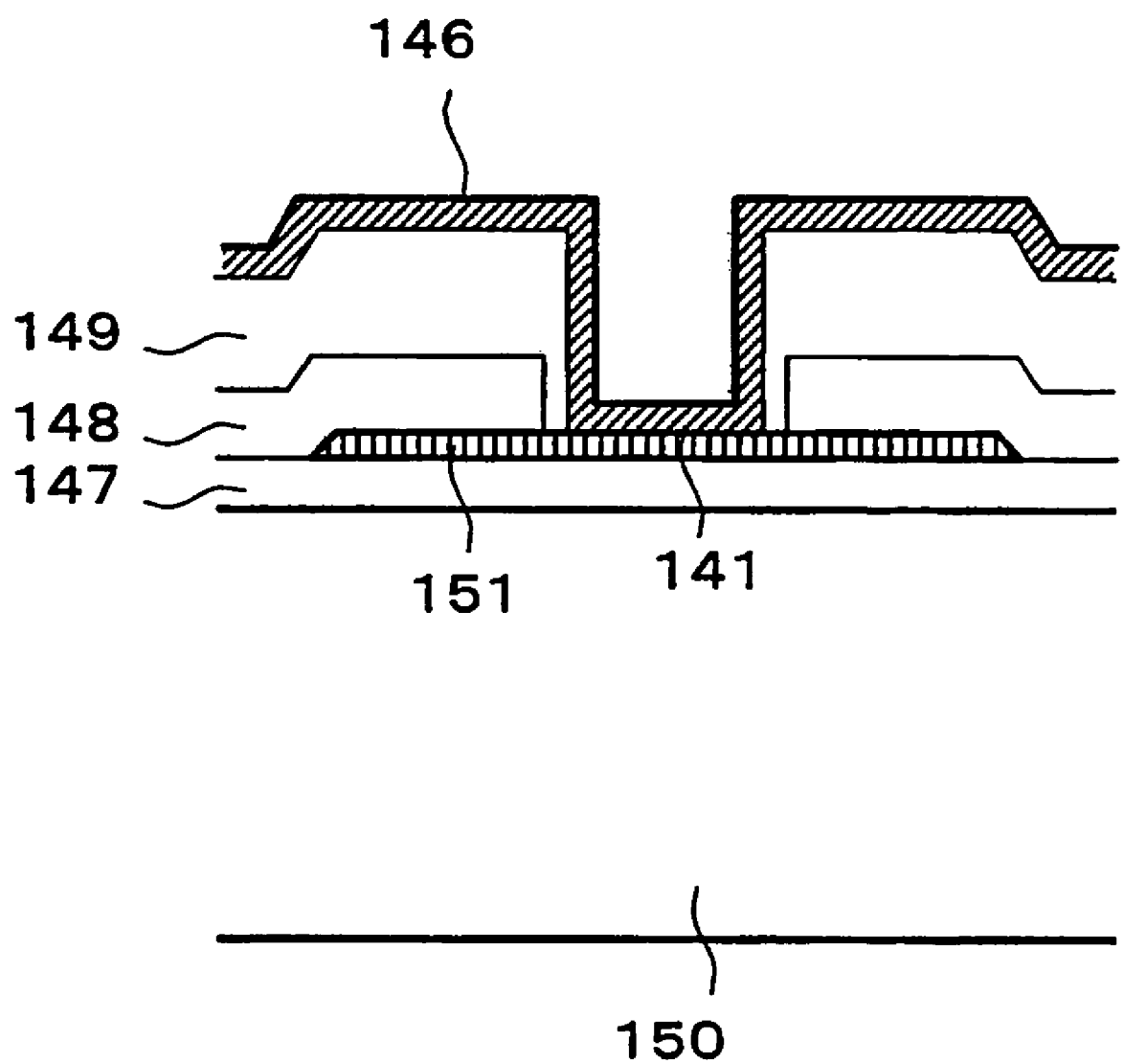
FIG. 13 is a cross sectional drawing of the pixel shown in FIG. 11 and the cut line XIII-XIII shown in FIG. 12.

FIG. 13 shows the wiring layer 151 corresponding to either the source or the drain of the second transistor 122 is connected to the reflective electrode 146 through the through hole contact 141.

FIG. 14 shows the wiring layer 152 corresponding to the gate of the second transistor 122 is connected to the wiring layer 151 corresponding to the source or the drain of the second transistor 122 through the through hole contact 142.

FIG. 15 shows the wiring layer 152 corresponding to the reference voltage line 108 is connected to the wiring layer 151 corresponding to the source or the drain of the second transistor 122 through the through hole contact 143.

FIG. 16 shows the electrode 144 that forms one electrode of the image signal memory 124 is connected to the wiring layer 152 corresponding to the reference voltage line 108 through the through hole contact 143 as shown in FIG. 15 as previously explained and the other electrode 151 which is a wiring layer 151 corresponding to the source or the drain of the first transistor between the electrode 144 and the wiring layer 152. In this construction, the image signal memory 124 is formed by the wiring layers that have more than or equal to two layers and the insulator layer that has more than or equal to one layer.

The insulation layers 147 and 148 as shown in FIG. 13 to FIG. 16 are constructed with a silicon nitride layer formed CVD (Chemical Vapor Deposition) process. The insulation layer 149 is formed by photo hardened polymer. The reflective layer 146 is made of aluminum to obtain high optical reflectivity. The electrode 144 is made of ITO (Indium Tin Oxide) of which upper surface is commonly used for the terminal port to make an electrically connection with the foreign termination external to the substrate which is not shown in the figures. The metal wiring layers 151 and 152 are made of a molybdenum-chrome alloy.

FIG. 17 shows alignment layers 165 and 167 filled between the substrate 150 of the active matrix side and the opposing substrate 163, the liquid crystal layer 166, the transparent electrode 164, the light shielding layer (black matrices) 168, the protection layer 169, the phase difference films 161 and 162 at the reverse side to the liquid crystal layer 166 on the substrate 163 and the polarizer 160. FIG. 17 further shows an example of monochrome display. A color filter layer is added to provide the color display.

Although not shown in FIG. 17, a diffusion film may be used for the purpose of obtaining wider viewing angle and paper-like presentation. The polarizer may have a characteristic of light diffusion. Such diffusivity may be obtained by surface-roughing the insulation layer 149, adding surface roughed insulation layer between the insulation layer 149 and reflective electrode 146 or using surface roughed reflective electrode 146 thereon so that appropriate light scattering in the reflected light and wider viewing angle are obtained and paper like image display presentation becomes possible. In the aspect of the resolution, it is desirable to provide the scattering property to the reflective electrode 146.

In the present embodiment, the first transistor 121 and the second transistor 122 are constructed by amorphous silicon TFT but another transistor such as poly silicon transistor is usable.

SECOND EMBODIMENT

Figure 18:
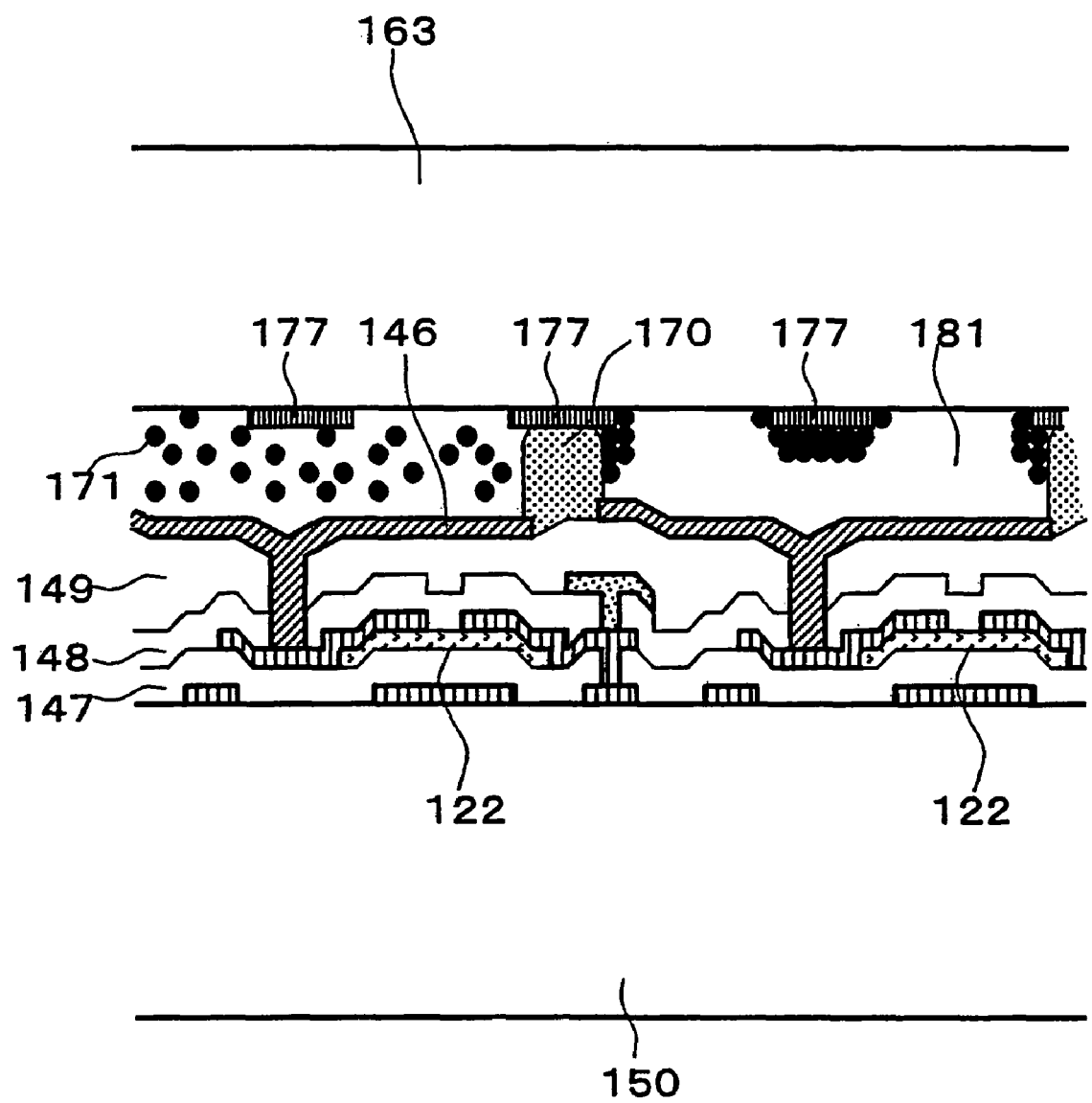
FIG. 18 is a cross sectional drawing of the display device regarding the second embodiment of the present invention.

Another embodiment using an electrophoretic display medium for the electro optic medium 123 for a display device is explained in the following. FIG. 18 shows the cross sectional view of an electrophoretic display device. The electrophoretic display medium is composed of the charged particles 171 and an insulating solvent 181.

For the charged particles 171, various organic pigments and inorganic pigments can be used in selection. Any one of carbon black, graphite, black iron oxide, ivory black, chromium dioxide etc. can be used in a single material or in a mixed combination. These pigments are coated with dispersing agents such as acrylic polymer and then the dispersion is enhanced. The electrically charge particles 171 can be preferably stabilized and improved in response time by enhancing the zeta potential of the particles with the surface-active agent dispersing agents.

For the insulating solvents, any one of xylene, toluene, silicon oil, fluid paraffin, organic chloride, various hydrocarbons and various aromatic hydrocarbons can be used in a single material or in a mixed combination. High transparency for the efficiency of usable light, high insulation that does not generate ions in voltage application for long life and low viscosity for the high migration are preferred. In an embodiment, silicon oil is used for the insulating solvent 181 and carbon black with 0.2 micrometers diameter coated with a plastic resin dispersed in 2 weight per cent therein. This mixture is filled in the gap between the two facing substrates and sealed off.

The construction of this embodiment is substantially similar to the first embodiment. The common electrode 177 is formed on the substrate 163 with a pattern. A portion of the common electrode 177 is also formed as insulating wall 170 which is commonly works as a wall for two adjacent pixels. Such construction of the patterning of the common electrode 177 is an important element to maximize the aperture rate of the pixel. For this purpose, it is preferred that the common electrode 177 is formed by the transparent conductive file or thin metal film.

The carbon black particles 171 are positively charged and disperse on the reflective electrode 146 when the voltage of the reflective electrode 146 is set to that of the common electrode 177. The black display has been confirmed from the side of the substrate 163 by this construction. When the voltage of the reflective electrode 146 is set 10V higher than that of the common electrode 177, the carbon black particles 171 are collected to the common electrode 177 and white display has been confirmed from the side of the substrate 163 by this construction.

Figure 37:
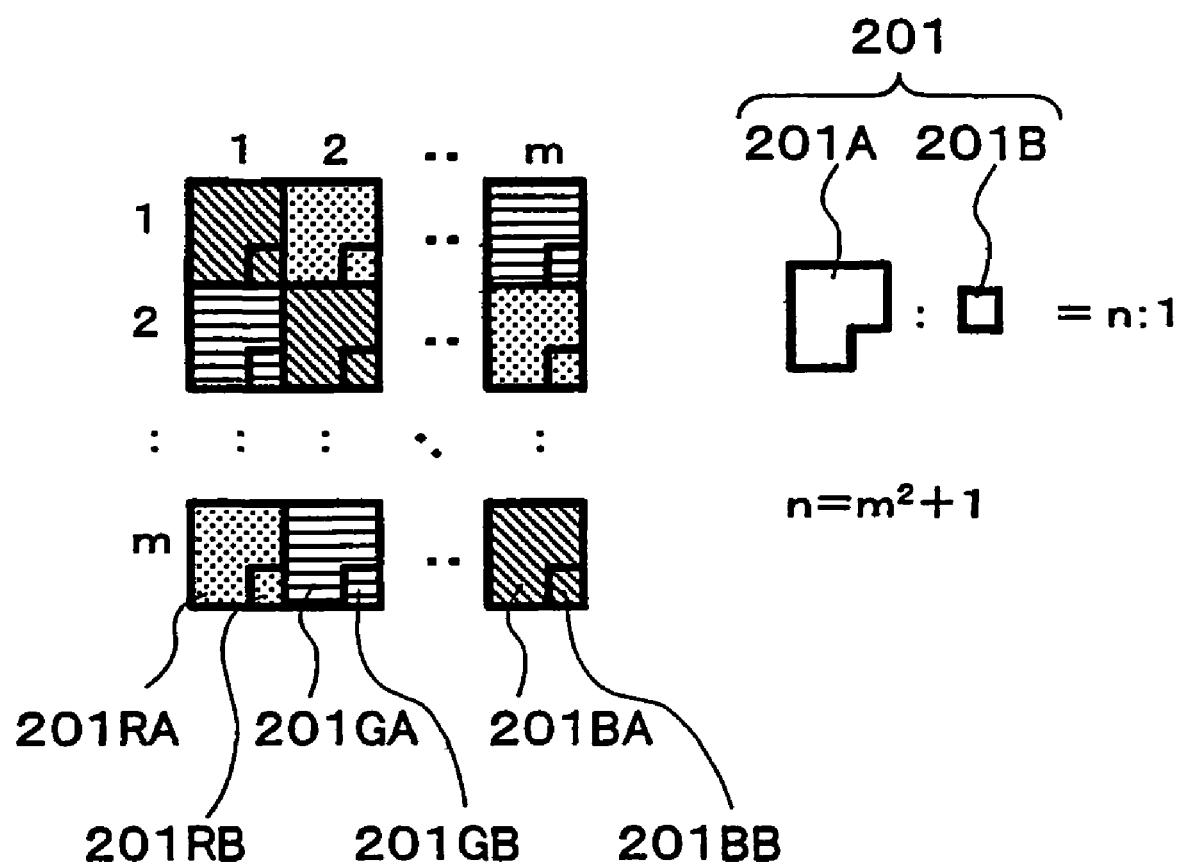
FIG. 37 is an explanatory drawing of the gradation display method.

Lateral electric fields are generated when the adjacent pixels have different display statuses. There is possibility that the charged particles 171 migrate over the boundary of the pixels if there is no insulating wall 170. The extreme phenomenon of this migration is to generate the inhomogeneous image display on the pixel array 107 due to the non-uniform density of the charged particles. In order to suppress this phenomenon, the insulating walls 170 are constructed to segregate the spatial region so that the charged particles 171 do not migrate. The spatial region is a region to include at least one sub-pixel (as shown in FIG. 37) or one pixel. In the present embodiment, the insulating walls 170 are constructed for every pixel to spatially segregate the electrophoretic display medium. The insulating walls 170 are formed by using a photo resin.

Figure 19:
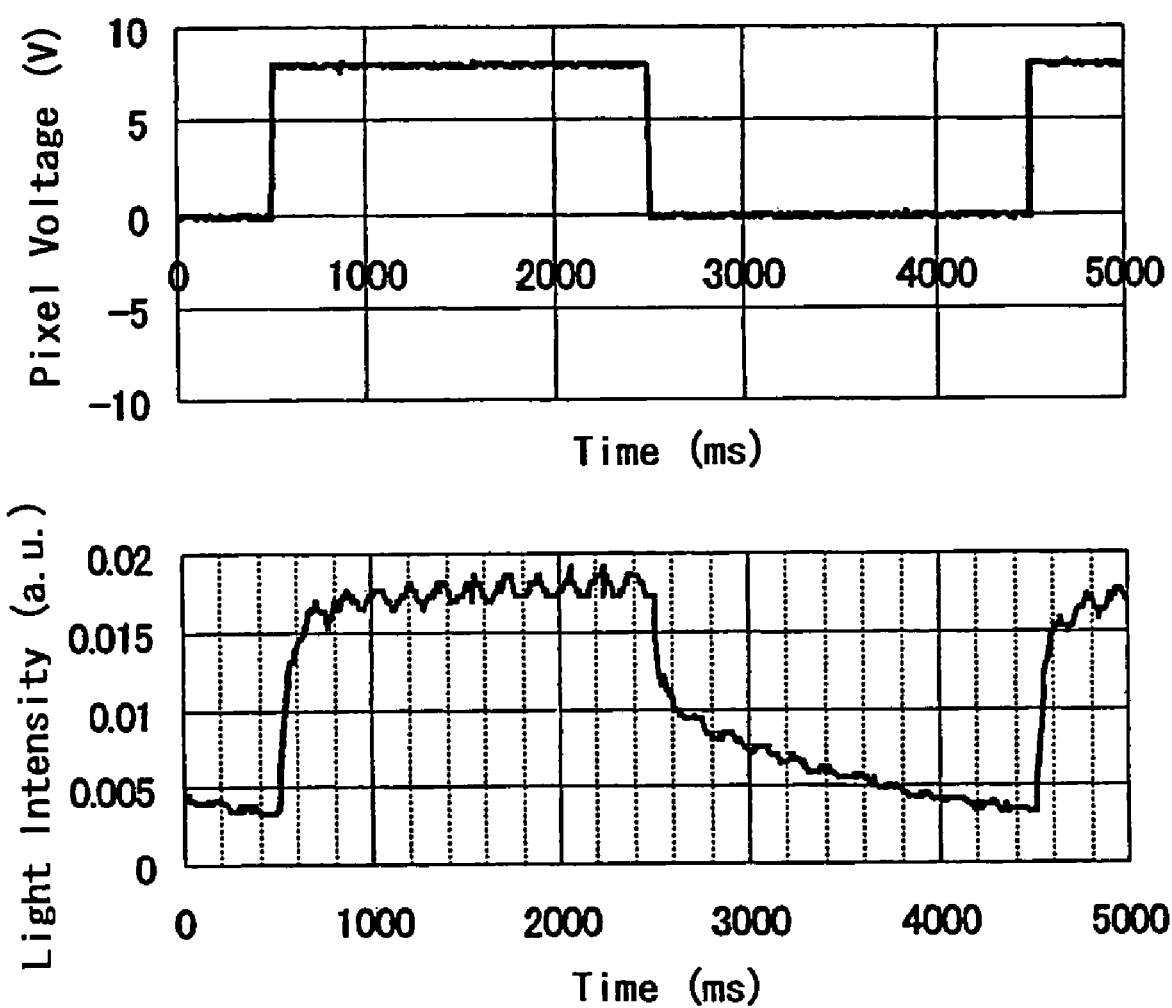
FIG. 19 is a drawing that shows an example of electro optical characteristics of the electrophoretic display medium.
Figure 20:
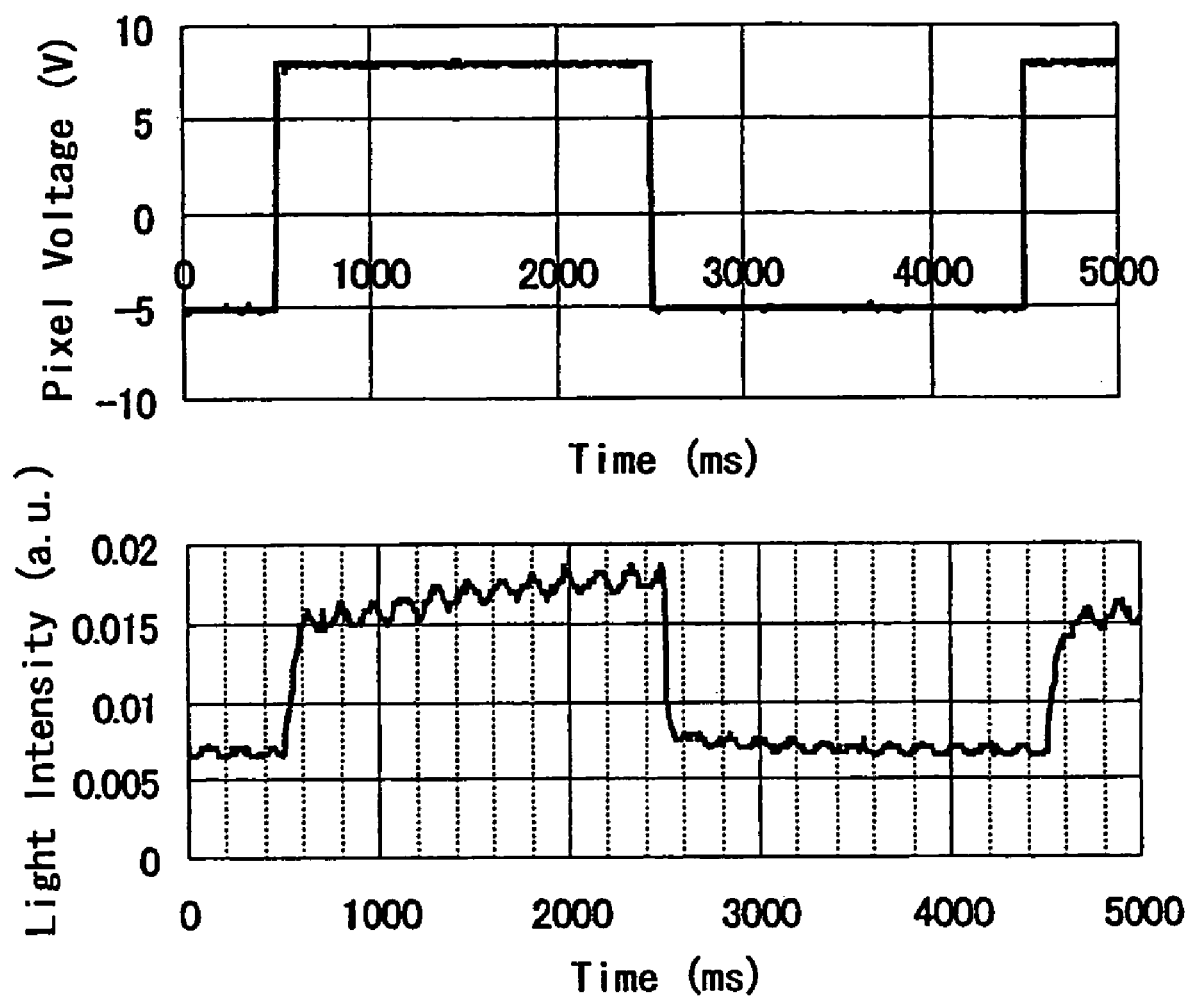
FIG. 20 is a drawing that shows an example of electro optical characteristics of the electrophoretic display medium.
Figure 21:
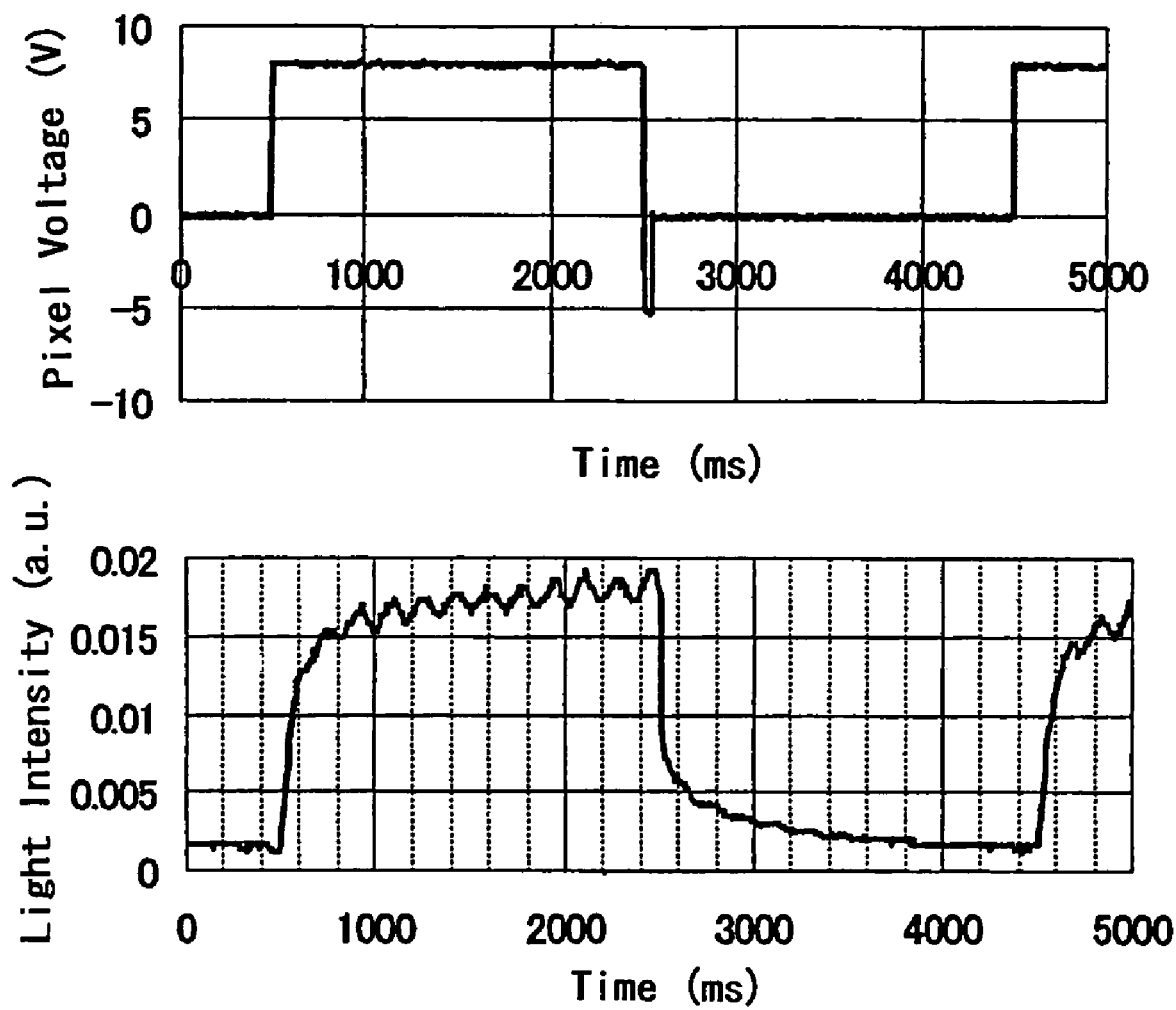
FIG. 21 is a drawing that shows an example of electro optical characteristics of the electrophoretic display medium.

The electro optical characteristics of the electrophoretic display medium used for the display device regarding the present invention are explained in the followings. The upper sections of the schematics shown in FIG. 19 to FIG. 21 present the voltages of the reflective electrode 146 against the common electrode 177, that is, pixel voltages which correspond to the driving waveforms. The lower sections of the schematics shown in FIG. 19 to FIG. 21 are the response waveforms of the light intensity of the display device. The horizontal axes show time in milliseconds.

The driving waveform in FIG. 19 show the voltage holding of the reflective electrode 146, that is, 8V for 500 ms to 2500 ms and 4500 ms to 5000 ms and the same voltage as that of the common electrode 177 in the other terms. The light intensity steeply increases and becomes shinning just after the voltage of the reflective electrode 146 changes from 0V to 8V at the time around 500 ms and 4500 ms. The light intensity gradually decreases and becomes dark just after the voltage of the reflective electrode 146 changes from 8V to 0V. However, the change from "shining" status to "dark" status is rather slow and the time of degradation to the low contrast ratio as 5:1 which is about the ratio that news papers provide needs a response time which is longer than one second. The transition from "shining" status to "dark" status is caused by the charged particles 171, which are pulled to the common electrode 177, diverting over the whole pixels and therefore the response time is rather long.

The driving waveform as shown in FIG. 20 indicates that the voltage of the reflective electrode 146 is 8V from 500 ms to 2500 ms and from 4500 ms to 5000 ms and is −5V otherwise.

The light intensity steeply increases and becomes shinning just after the voltage of the reflective electrode 146 changes from −5V to 8V at the time around 500 ms and 4500 ms. The light intensity steeply decreases and becomes dark just after the voltage of the reflective electrode 146 changes from 8V to −5V. However, the contrast ratio is rather low as 3 or less. Because the voltage of the reflective electrode 146 is set −5V and the charged particles 171 are once pulled to the common electrode 177 but are effectively pushed back. The charged particles 171 are pulled to the reflective electrode 146 and stay there, and are suppressed to divert over the whole pixels so that the light intensity of "dark" status does not decrease so much and the ultimate contrast ratio is low.

A driving method that solves the problem explained by using FIG. 19 and FIG. 20 is shown in FIG. 21. The driving waveform in FIG. 21 indicates that the voltage of the reflective electrode 146 is 8V from 500 ms to 2500 ms and from 4500 ms to 5000 ms and has an undershoot to −5V at the time 2500 ms prior to the same voltage as the common electrode 177. The light intensity steeply increases and becomes shinning just after the voltage of the reflective electrode 146 changes from 0V to 8V at the time around 500 ms and 4500 ms. The light intensity steeply decreases and becomes dark just after the voltage of the reflective electrode 146 changes from 8V to −5V and the returns to 0V.

The ultimate light intensity of "dark" status is lower than those shown in FIG. 19 and FIG. 20 but the contrast ratio is rather high.

Figure 22:
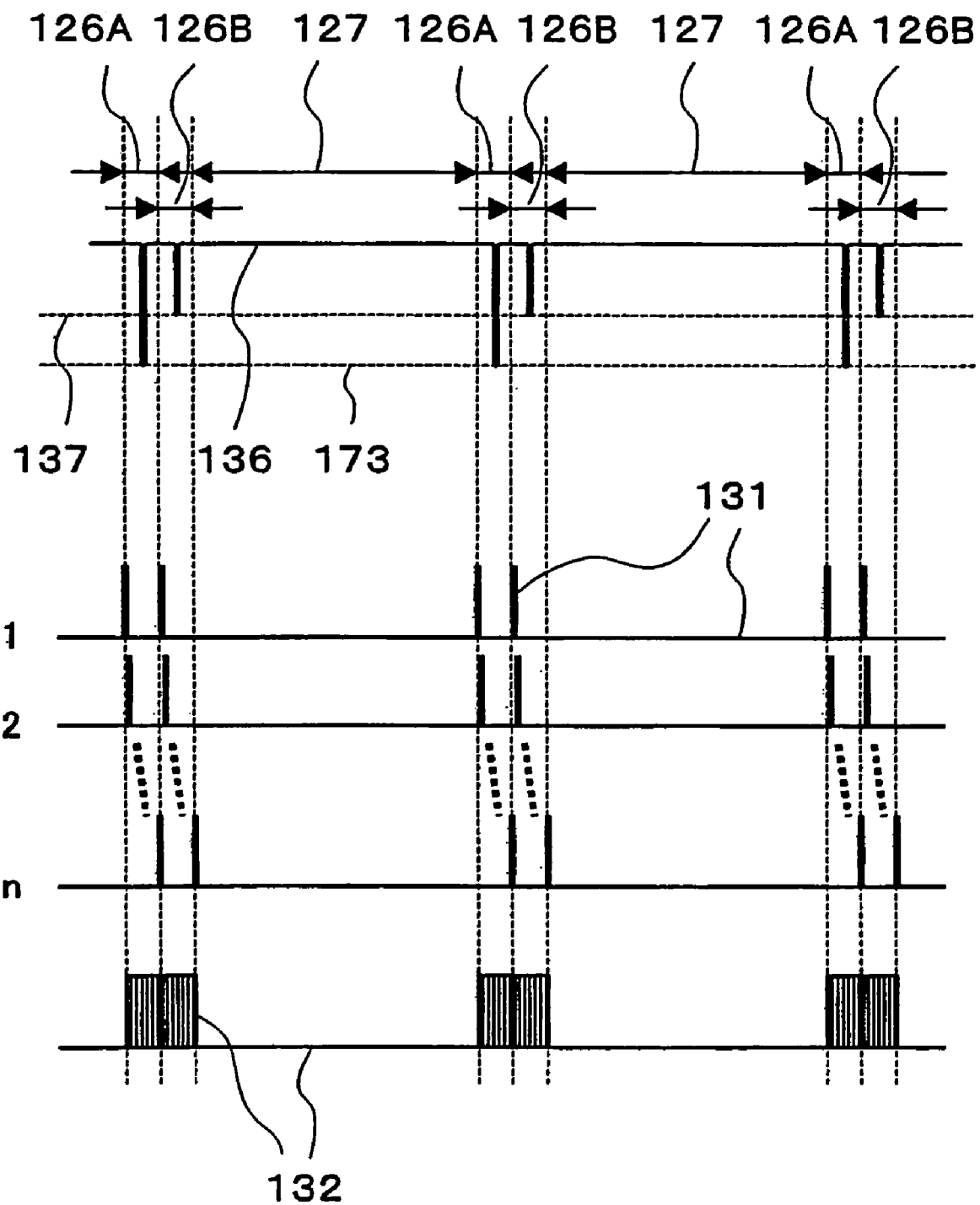
FIG. 22 is a drawing that shows a driving sequence of the reference voltage line 108, the scanning signal line 109, the image signal line 110.

The driving sequences of the reference voltage line 108, the scanning signal line 109 and the image signal line 110 are shown in FIG. 22. The driving sequence is fundamentally divided into two stages as a scanning interval 126 (126A and 126B) and the image holding interval 127. The scanning interval 126 composes of the refresh time of the image signal memory 124 and updating of the voltage applied to the electro optic medium 123 which is an interval of updating the displayed image. On the other hand, in the image holding interval 127, the scanning signal to scan the image display is paused and the image display statuses which correspond to the status of the image signal memory 124 at each pixel. The scanning interval 126 is divided into the first scanning interval 126A and the second scanning interval 126B.

The driving waveform 136 of the reference voltage line 108 is set to be a reset voltage for a certain time in the timing to scan the corresponding scanning signal line 109 in the first scanning interval 126A, is set to be the common voltage 137 for a certain time in the timing to scan the corresponding scanning signal line 109 in the first scanning interval 126B and is set to be positive voltage against the common electrode 177 in the rest of the intervals.

Each scanning signal line 109 is scanned in the both intervals of the first interval 126A and the second interval 127B. The image signal line 110 supplies the driving waveform in response to the image data in both intervals 126A and 126B and set the voltage 132 that sets the second transistors 122 in OFF state in the image holding interval 127. This OFF state is necessary to stop the fluctuation of the voltage of the node 125 of the image signal memory 124 which keeps the second transistor to be in OFF state through the OFF resistance of the first transistor.

Figure 23:
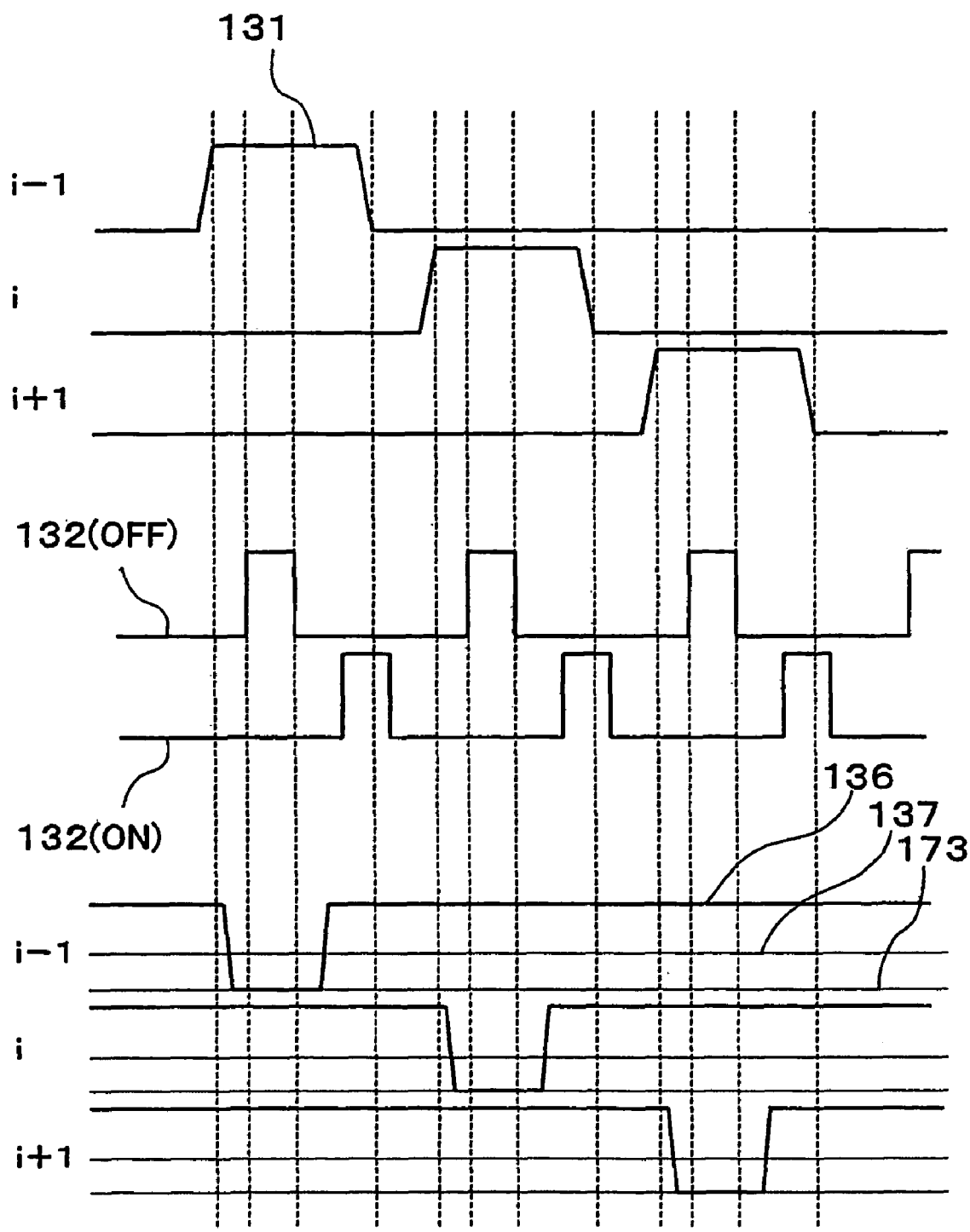
FIG. 23 is an explanatory drawing of the driving method during the scanning interval 126A.
Figure 24:
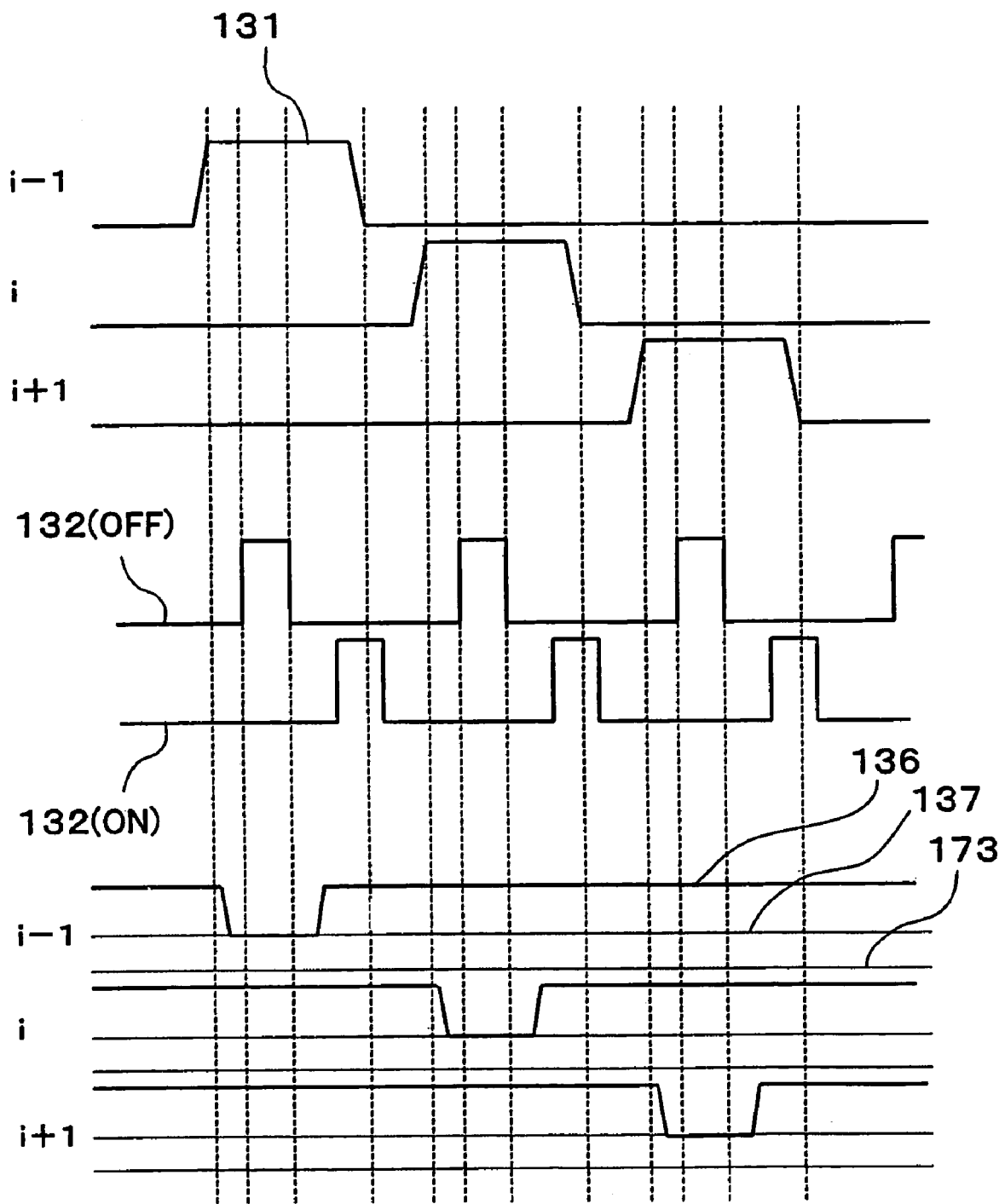
FIG. 24 is an explanatory drawing of the driving method during the scanning interval 126B.

The details of this driving method may be explained by using FIG. 23 and FIG. 24. FIG. 23 shows the waveforms of the neighboring three scanning signal lines 109 arbitrarily selected in the scanning interval 126A. FIG. 24 shows the waveforms of the neighboring three scanning signal lines 109 arbitrarily selected in the scanning interval 126B.

The driving waveform 132 of the image signal line 110 has fundamentally two different waveforms for the cases when the voltage difference between the both terminals of the electro optic medium 123 is about 0V and the difference voltage between the voltage 136 of the reference voltage line 108 and the common voltage 137. The driving waveform 132 (OFF) of the image signal line 110 shows the waveform for the case when the voltage difference between the both terminals of the electro optic medium 123 is about 0V and the driving waveform 132 (ON of the image signal line 110 shows the waveform for the case when the voltage difference between the both terminals of the electro optic medium 123 is the difference voltage between the voltage 136 of the reference voltage line 108 and the common voltage 137.

The driving waveforms of the image signal line 110 shown in FIG. 23 and FIG. 24 show two waveforms that set several sequential pixels in OFF state and ON state. But the actual driving waveform is mixed with such two waveforms in response to the image signals.

The i-th scanning signal line 109 is, for example, explained when the driving waveform 132 (OFF) is applied to the image signal line 110 in FIG. 23. Being synchronous with the event that the gate pulse corresponding to the i-th scanning signal line 109 rises and the first transistor 121 is set in ON state, the driving waveform 136 of the corresponding reference voltage line 108 is set from the positive voltage to the reset voltage.

Right after then, the driving waveform 132 (OFF) of the image signal line 110 rises and the second transistor becomes ON state since the first transistor is in ON state.

Since the voltage of the driving waveform 136 of the reference voltage 108 is in the reset voltage 173, the negative voltage against the common electrode 120 is applied to the electro optic medium 123. After then, the driving waveform 132 (OFF) of the image signal line 110 falls and the second transistor 122 becomes OFF state with keeping the status that the negative voltage against the common electrode 120 is applied to electro optic medium 123. In the following time, the driving waveform 136 of the reference voltage line 108 is set to the positive voltage from the reset voltage 173 again and the voltage of the driving waveform 132 (OFF) of the image signal line 110 pulls down the gate pulse 131 to low voltage level. As the result, the first transistor becomes OFF state with keeping the voltage of the node 125 of the image signal memory 124 to set the second transistor in OFF state.

In FIG. 23, the i-th scanning signal line 109 is, for example, explained when the driving waveform 132 (ON) is applied to the image signal line 110 in FIG. 23. Being synchronous with the gate pulse corresponding to the i-th scanning signal line 109 rises and the first transistor 121 is set in ON state, the driving waveform 136 of the corresponding reference voltage line 108 is set from the positive voltage to the reset voltage. Right after then, the driving waveform 132 (ON) of the image signal line 110 rises and the second transistor becomes ON state since the first transistor is in ON state. Since the voltage of the driving waveform 136 of the reference voltage 108, a positive voltage against the common electrode 120 is applied to the electro optic medium 123.

In the next sequence, the gate pulse 131 falls and the first transistor becomes OFF state with keeping the second transistor 122 ON state as the voltage of the node 125 of the image signal memory 124 set the second transistor in ON state. More over, the driving waveform 132 (ON) of the image signal line 110 falls and then the second transistor 122 is kept in ON state by the voltage of the node 125 of the image signal memory 124 until the next scanning interval 126 starts. Therefore, the voltage between the reference voltage line 108 and the common electrode 120 is applied to the electro optic medium 123 through the second transistor 122.

FIG. 24 shows a driving sequence that the setting voltage of the pulse synchronously with the gate pulse 131 of the driving waveform of the reference voltage line 108 shown in FIG. 23 is alternated with the common voltage 137 from reset voltage 173.

It is possible that the high-speed response and contrast ratio become compatible by applying the circuit construction and the driving method to the display device. Because the charged particles 171 is pulled by the second electrode 146 by writing a black-image driving voltage into the second electrode 146 and the voltage difference between the first electrode 177 and the second electrode 146 decreases in time due to the OFF state of the second transistor 122 and the low specific resistance of the ink. According to the decrease of the voltage difference between the first electrode 177 and the second electrode 146, the charged particles 171 homogeneously diverge from the surface of the electrodes 177 and 146. Resultantly, a predetermined black-image light intensity is obtained and a high contrast ratio is possible.

By modifying the driving sequences as shown in FIG. 23 and FIG. 24, the falling of the pulse in the driving waveform 132 (ON) of the image signal line 110 can be made before the falling of the gate pulse 131 of the scanning signal line 109 corresponding thereto.

Figure 25:
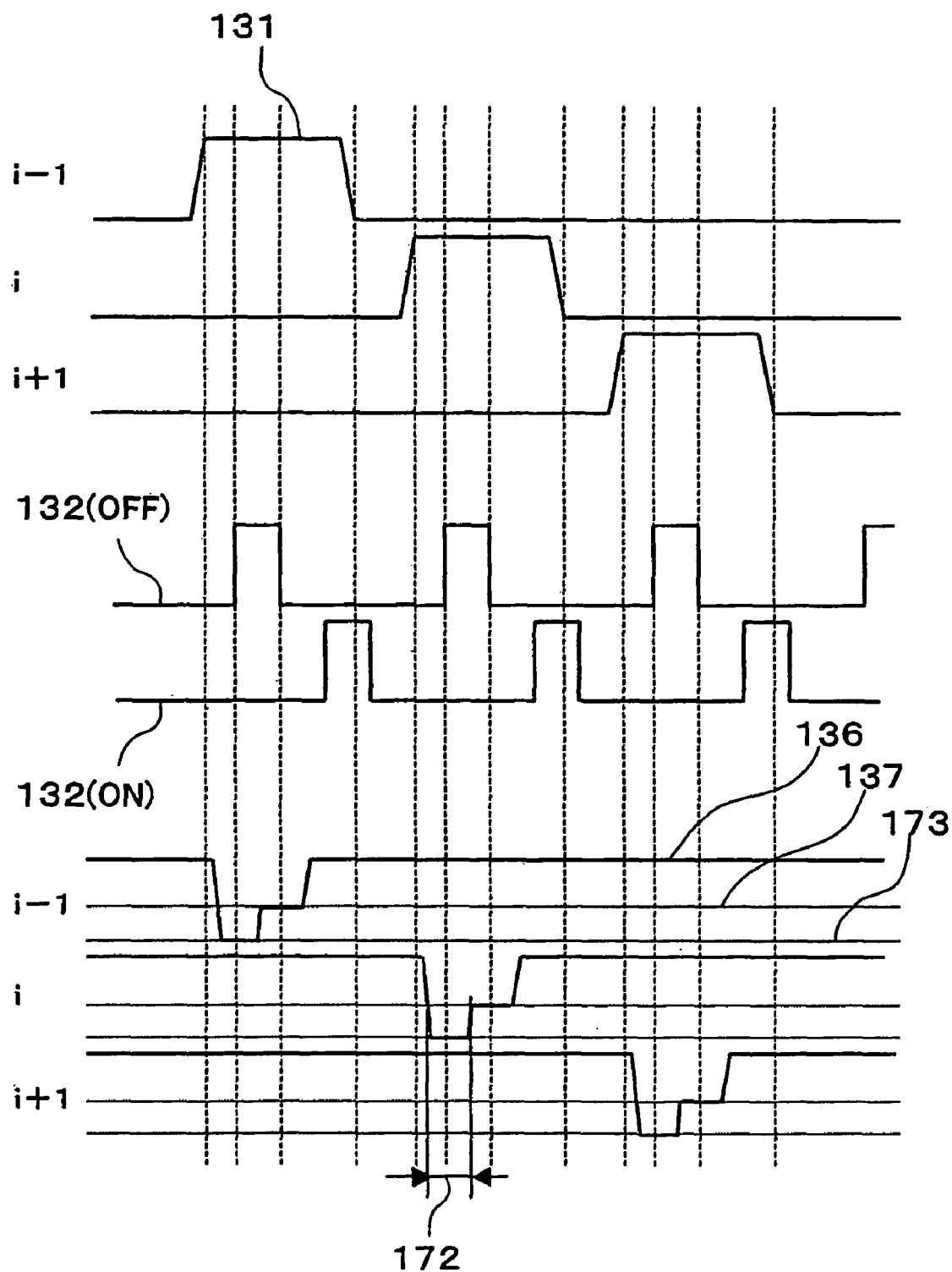
FIG. 25 is an explanatory drawing of the driving method during the scanning intervals 126A and 126B.

Another variation of the present driving method is explained by using FIG. 25. The differences from FIG. 23 are the driving waveform 136 of the reference voltage line 108. FIG. 25 shows the driving waveform 136 is set in the common voltage 137 during when the driving waveform 132 (OFF) of the image signal line 110 that is to keep the voltage of the node 125 of the image signal memory 124 so that the second transistor becomes OFF state after the driving waveform 136 is set in the reset voltage 173 synchronously with the gate pulse 131 of the scanning signal line 109. This driving method enables to carry out the reset and the dispersion of charged particles by a single scanning.

Figure 26:
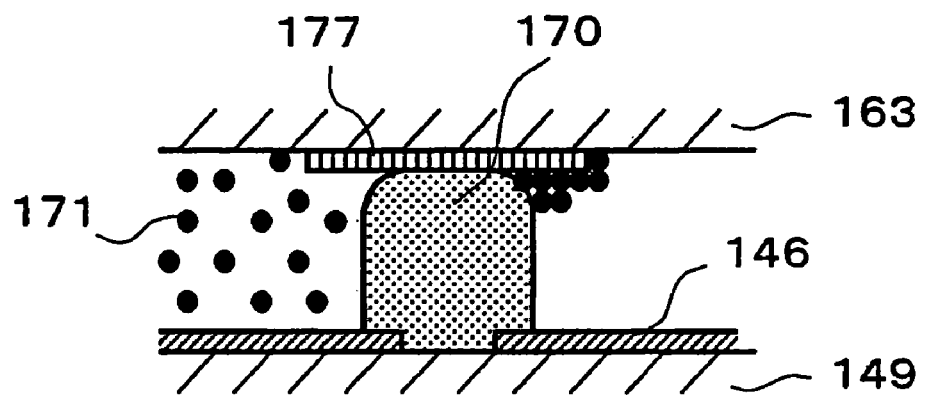
FIG. 26 is a drawing that shows an embodiment of the structure of the insulation wall 170 and the common electrode 177.

The figures of FIG. 26 to FIG. 34 show the embodiments of the construction of the insulating wall 170 and the common electrode 177. FIG. 26 shows the zoomed-in view of the portion of the insulating wall 170 shown in FIG. 18. The insulating wall 170 is built between the reflective electrode 146 on the active matrix substrate and the common electrode 177 on the other substrate 163. Since the common electrode 177 functions as a common one for two adjacent pixels, it is possible to keep large aperture ratio of the display area against the whole panel area. When a light absorbing material is used for the insulating wall 170, it is possible to stop the outer light coming into TFT region through the gaps between the electrode 146 and the common electrode 177.

Figure 27:
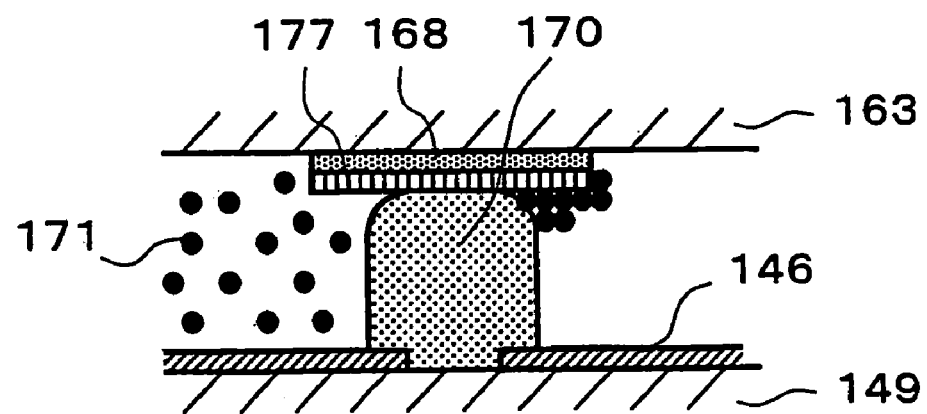
FIG. 27 is a drawing that shows another embodiment of the structure of the insulation wall 170 and the common electrode 177.

The difference between FIG. 27 and FIG. 26 is that the light shielding layer 168 is formed between the substrate 163 and the common electrode 177. The light shielding layer 168 has a function to protect the invasion of the light through the gaps of adjacent gaps when the common electrode 177 is made of a transparent conductive film. On the other hand, the light shielding layer 168 has a function to suppress the unnecessary reflection of the light reflected by the common electrode 177 when the common electrode 177 is made of the metal film.

Figure 28:
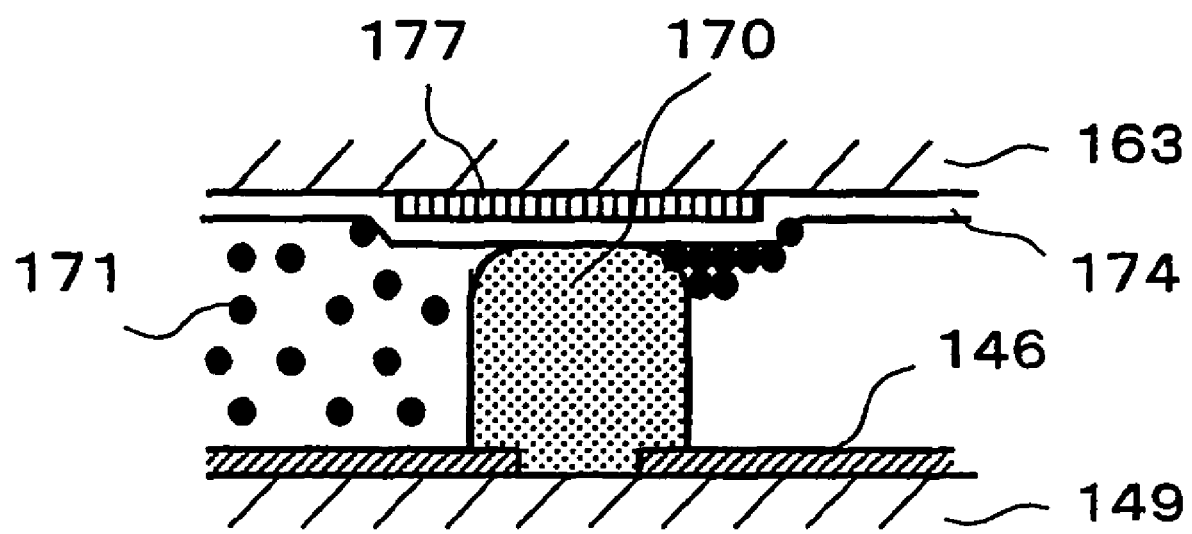
FIG. 28 is a drawing that shows another embodiment of the structure of the insulation wall 170 and the common electrode 177.

FIG. 28 shows that the tightly contacting layer 174 is formed on the common electrode 177. The tightly contacting layer 174 is, for example, made of a transparent organic layer and has an effect to increase the tightness of tight contact between two substrates 150 and 163.

Figure 29:
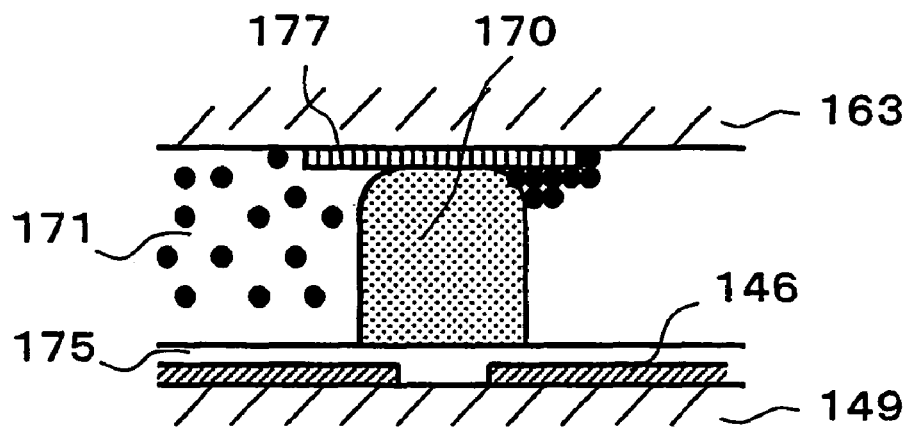
FIG. 29 is a drawing that shows another embodiment of the structure of the insulation wall 170 and the common electrode 177.

FIG. 29 shows that a protecting layer 175 is formed on the reflective electrode 146. This is for protecting the reflective electrode 146 from erosion.

Figure 30:
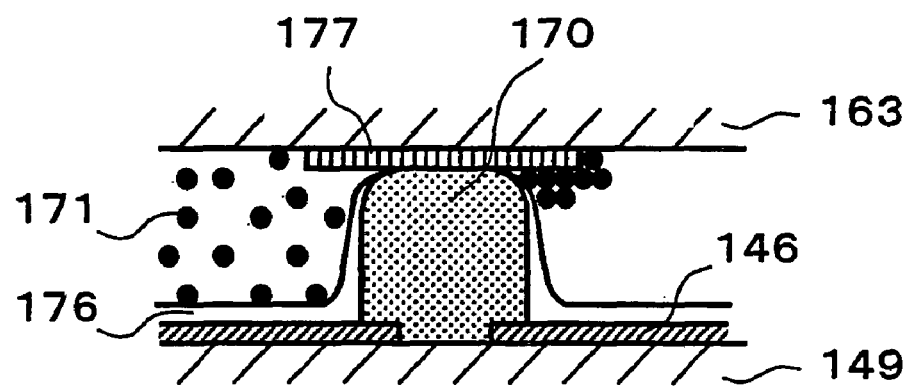
FIG. 30 is a drawing that shows another embodiment of the structure of the insulation wall 170 and the common electrode 177.

FIG. 30 shows that the insulation layer 170 is formed by covering the protection layer 176 on the reflective layer 146.

Figure 31:
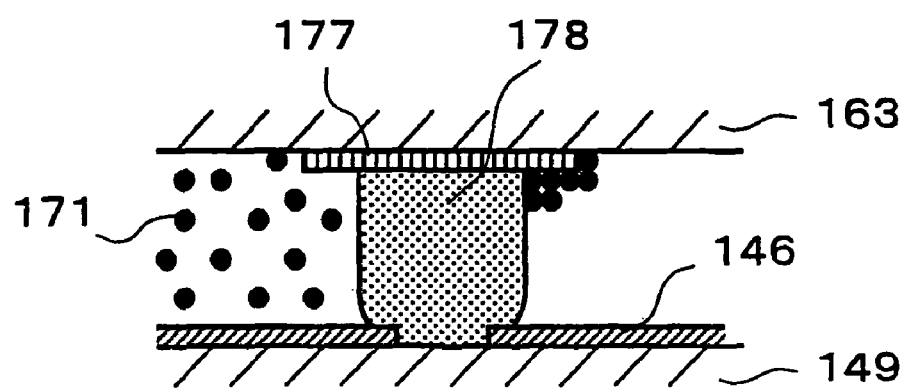
FIG. 31 is a drawing that shows another embodiment of the structure of the insulation wall 170 and the common electrode 177.

FIG. 31 shows an embodiment where the insulation layer 170 is formed on the common electrode 177.

FIG. 32 shows an embodiment where the common electrode 177 is formed to cover the insulating wall 178 after the insulating wall 178 is formed on the substrate 163. A protection layer 179 is formed on the reflective electrode 146 in order to keep the insulation against the common electrode 177. By using this construction, it is possible to increase the aperture ratio since the common electrode 177 increases the area to absorb the charged particle 171 as working as a wall electrode and the displaying area decreases against the view of an observer when the charged particles 171 are collected.

FIG. 33 shows an embodiment where the light shielding layer 168 which is necessary for the construction that the common electrode 177 is formed by a transparent conductive film is formed.

FIG. 34 shows an embodiment where the protection layer 180 to keep insulation between the common electrode 177 and the reflective electrode 146 is piled on the common electrode 177. Of cause, the protection layer 180 to keep the insulation between the common electrode 177 and the reflective electrode 146 can be formed both substrates 150 and 163.

Figure 35:
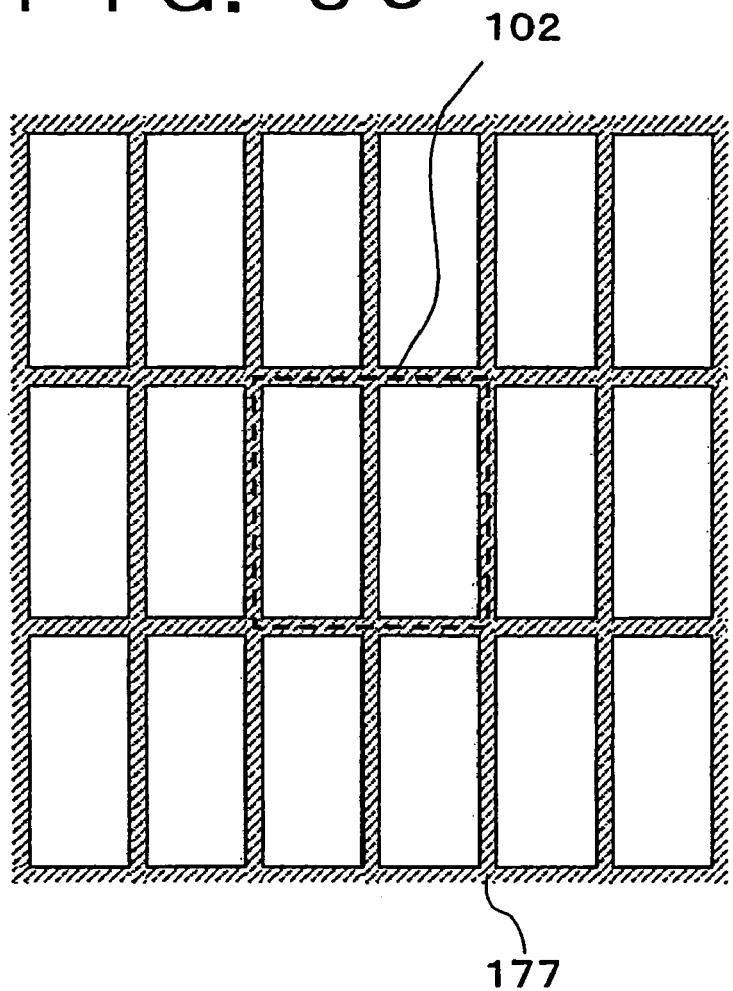
FIG. 35 is a drawing that shows another embodiment of the structure of the insulation wall 170 and the common electrode 177.

FIG. 35 shows an example of layout of the pixel 102 and the common electrode 177 where an electrode to extend the common electrode 177 to outside is formed in the side thereof.

Figure 36:
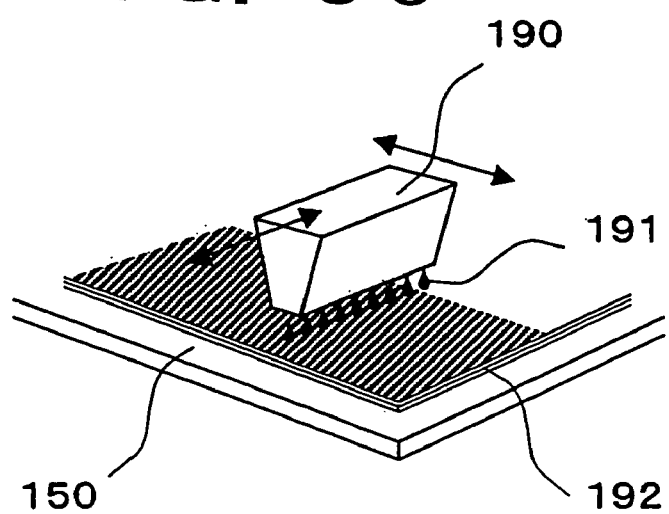
FIG. 36 is a drawing that shows an embodiment of the process to form the charged particles 171 and the insulation solvent 181 in a printing method.

FIG. 36 shows an embodiment that the charged particles 177 and an insulating solvent 181 are formed by a printing process. The electrophoretic display of the present invention has insulating wall for each pixel and therefore it is difficult to fabricate a panel by a conventional process such that the liquid crystal is filled after two substrates aligned in parallel. Ink jet printing is preferred to homogeneously disperse the charged particles 171 and the insulating solvent 181 in each pixel. By scanning the area confined by the insulating wall 192 formed around the displaying region by means of the printer head 190, the ink which is made of the charged particles 171 and the insulating solvent 181 is homogeneously dispersed.

Since the display device of the present invention has binary image display for each pixel, it is necessary to carry out dithering for gradation presentation. When the display device is conformed by square shaped pixels with mono-chrome presentation in five-step gradation by every 2×2 pixels, ten-step gradation by every 3×3 pixels, seventeen by 4×4, twenty-six by 5×5 and so on where the gradation of $(n^2+1)$ for n×n pixels are possible. The resolution degrades to be 1/n and further does to one thirds for chromatic presentation.

As shown in FIG. 37, it is possible to suppress the degradation of resolution in gradation presentation by means of sub-pixels. The gradation presentation is explained by using sub-pixels in FIG. 37. One pixel is composed of two sub-pixels 201A and 201B. For the R pixel, these two sub-pixels are described by 201RA and 201RB. The gradation presentation by using m×m pixels 201 is carried out. The area ratio of the sub-pixels is n:1 and the relation $n=m^2+1$ is satisfied. Several examples of the gradation are shown in Table 1.

TABLE 1

| m | N | Mono Chromatic Gradation Number $N^2$ | Color Gradation Number $N^2/3$ | Pixel Number $2 \times m^2$ |
|---|---|---|---|---|
| 1 | 2 | 4 | 1 | 2 |
| 2 | 5 | 25 | 8 | 8 |
| 3 | 10 | 100 | 33 | 18 |
| 4 | 17 | 289 | 96 | 32 |
| 5 | 26 | 676 | 225 | 50 |
| 6 | 37 | 1369 | 456 | 72 |
| 7 | 50 | 2500 | 833 | 98 |
| 8 | 65 | 4225 | 1408 | 128 |

For example, the pixel 201 is divided into sub-pixels so that 2:1 area ratio is obtained for n=2 if m=1. The sub-pixel for the area ratio 1 is only ON state for the gradation m=1, the sub-pixel for area ratio 2 is only ON state for the gradation m=2 and the both sub-pixels are ON state for the gradation m=3. In this manner, four-step gradations are obtained including m=0. The pixel 201 is divided into the sub-pixels so that 5:1 area ratio is obtained for n=5 if m=2. Only one of the sub-pixels that have 1 for the area ratio is set to be ON state for gradation m=1, two of the sub-pixels that have 1 for the area ratio for gradation m=2 are set to be ON state, three of the sub-pixels that have 1 for the area ratio for gradation m=3 are set to be ON state and all of sub-pixels that have 1 for the area ratio for gradation m=4 are set to be ON state Only one of the sub-pixels that have 5 for the area ratio is ON state for gradation m=5 and only one of the sub-pixels that have 5 for the area ratio and another only one of the sub-pixels that have 1 for the area ratio are set to be ON state By this method, 25-step gradation including O gradation can be presented.

By comparing with a square pixel in 3×3 pixels configuration, the square pixel scheme has 10-step gradation but the gradation configuration in the present invention has 100-step gradation.

The configuration that the insulating wall 170, the common electrode 177 and the light shielding layer 168 are formed by printing-method is explained.

Figure 38:
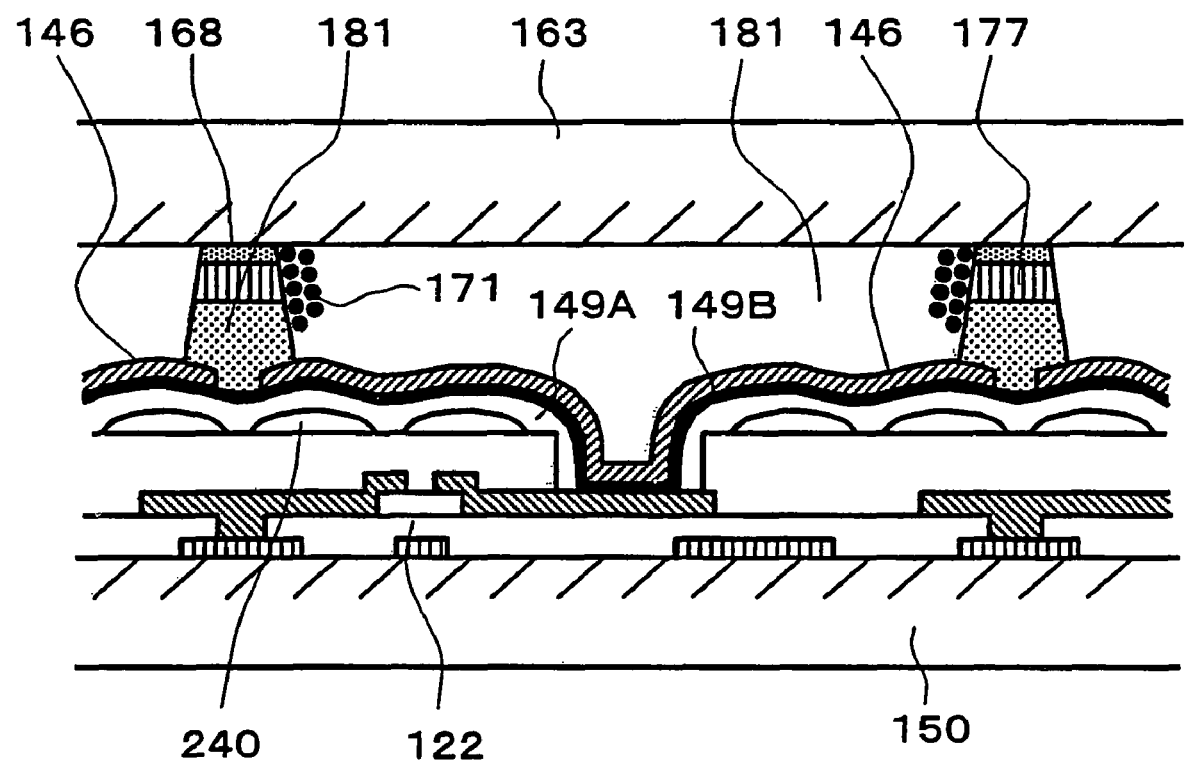
FIG. 38 is a cross sectional drawing of the panel which has the insulation walls formed by the reverse printing method.

FIG. 38 shows the cross sectional view of the panel to which the insulating wall formed by the reverse printing method. By the reverse printing method, the pattern of the insulating wall 170 is used as a pressing salient and the common electrodes 177 and the black matrices 168 are formed on the insulating walls 170 one by one.

Figure 39:
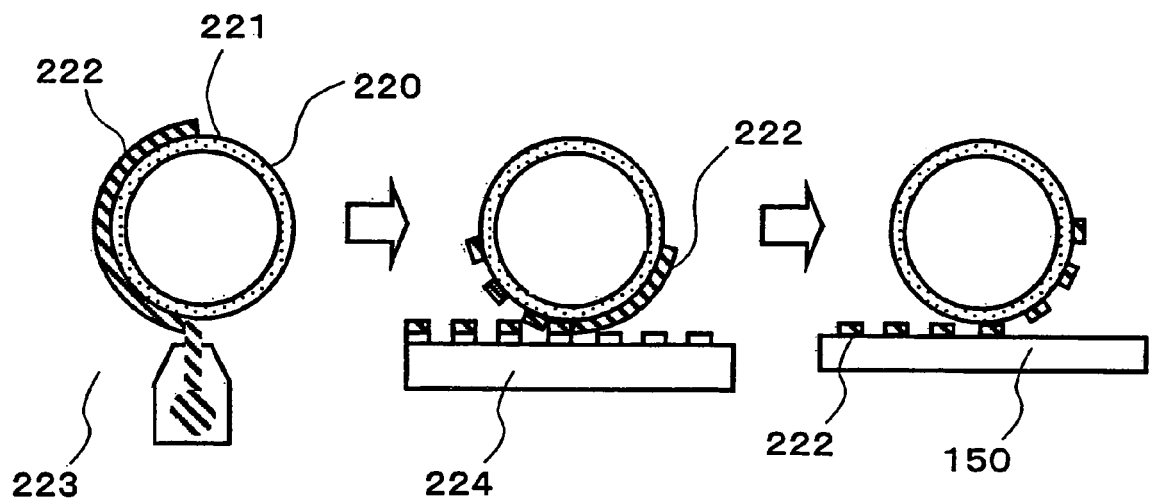
FIG. 39 shows the process to form the insulation wall structure by the reverse printing method.

FIG. 39 shows the process to form insulating walls 170 by the reverse printing method. The reverse printing method is a printing method to mainly use the repellency of the printing ink. The printing process is composed of the following three steps.

(1) a step to form the ink coated surface 222 by coating the ink over ink-repellent blanket 223 wound around the ink transfer cylinder 221 by using the ink coating apparatus 223

(2) a step to transfer the ink coated surface 222 on the ink transfer cylinder 221 to the pressing salient which composes reverse printing patterns and removes therefrom (3) a step to transfer the ink remaining on the transfer cylinder 221.

Figure 40:
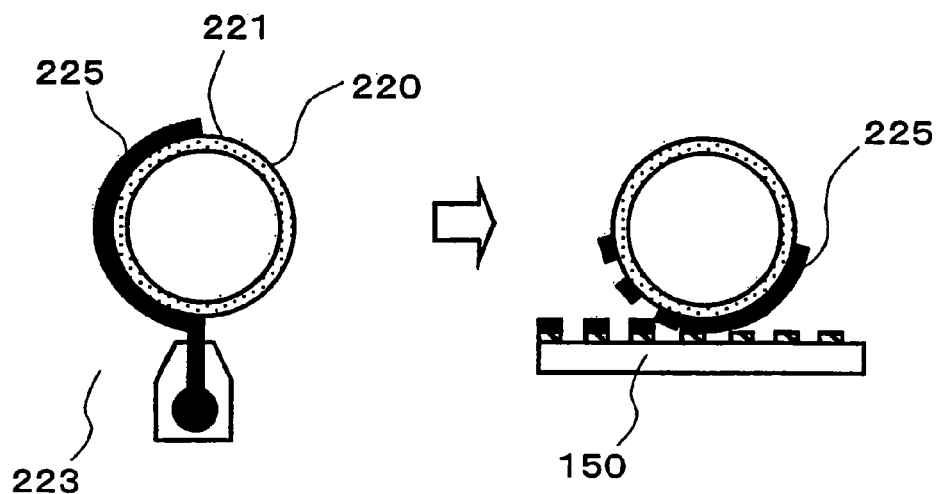
FIG. 40 shows the process to form the common electrode structure the reverse printing method.

FIG. 40 shows a process to form the common electrode 177 on the insulating walls 170 by applying the reverse printing method. Since the insulating walls 170 which are the base layer are used as a image forming salient, it is possible to transfer and pile the ink on the ink coating surface 225 in a manner of self alignment against the below layers and no image printing salient 224 (FIG. 39) is required. The merit to form the a thick metal layer 177 is to suppress the dispersion of the charged particles 171 in the direction to the display surface when the charged particle 171 is collected to the common electrode 177 and therefore the high aperture ratio is obtained.

When an organic material is used for the insulating wall 170, the form can be controlled by the thermal process. It is possible to make the upper surface of the insulating wall 170 smaller than the contact surface of the insulating wall 170 to the substrate 150. Since the sizes of the piling common electrodes 177 and the light shielding layer (black matrix) 168 are determined in reference to the upper surface size, these sizes can be smaller than those of base size of the insulating wall 170. The room made in the pixels by this construction can be the buffering region of the charged particles 171 when they are collected to the common electrode 177 and an effect to increase the aperture ratio is obtained.

FIG. 38 shows a construction that a corrugation structure 240 is formed under the reflective electrode 146 and a corrugation layer consisting of the leveling layer 149. Therefore the reflecting layer has a corrugation surface to be compliant to the corrugation layer therebelow and has a function to scatter the incident light to the display device. The corrugation structure 240 is constructed by a thermal deforming process of the plane-patterned resin.

The leveling layer 149 is formed by coating but the portion of the contact of the reflective electrode 146 to the lower electrode is removed. The leveling layer 149 is formed by a single layer but may be formed by layers more than two. At least one of the leveling layers is preferred to be made of a black-colored resin.

FIG. 38 shows an example of piling structure of the second leveling layer 149B consisting of the first leveling layer 149A and the black-colored resin. The reason why the black-colored resin is used for the leveling layer is to suppress the invasion of the incident light to the first transistor 121 and the second transistor through the gap of the reflective electrode 146. In other words, the leveling layer consisting of the black-colored resin works a light shielding layer.

When the semiconductor layers of the first transistor or the second transistor is irradiated by a light, optically induced electronic conduction is generated and the transistors operate unexpectedly. In addition, the influence by the abnormal operation due to the optically induced electronic conduction is larger than the conventional display devices since the display device regarding the present invention is characterized by the lower frame frequency less than 60 Hz than those for the conventional display devices.

The light shielding layer 168 formed on the facing substrate 163 and the common electrode 177 has a function to cut the incident light from the outside of the display device but not to cut the incident light coming in the slant angle against the plane of the display device and passing through the gap of the reflective electrode 146.

On the other hand, since the leveling layer 149B made of black-colored resin is formed to cover all gaps of the reflective electrode 146, it is possible to cut all lights passing through the gap of the reflective electrode 146. The other method to form the corrugation layer is a phase separation method by thermal process against the coated black-colored resin layer. It is also possible to use light sensitive film which has a corrugation structure.

THIRD EMBODIMENT

The difference of the present invention from the first and the second embodiments is that the present invention uses a memory capability of the display. The "memory capability of the display" implies the displayed image is maintained even after the power is switched off.

As for the examples of display methods having memory capability, there are electrophoretic display, electrochromic display, cholesteric liquid crystal display, liquid moving display, bi-stable twist nematic liquid crystal display and ferroelectric liquid crystal display. These displays and the display methods may be preferably applicable to the present invention. But the present invention can be realized with other technologies that have the display properties having memory capability as well.

The first technical problem of the display methods having memory capability is the necessity that voltage or electric current is consistently applied to the display until the response of re-writing the display images is completed. When the conventional technology that is constructed with one transistor and one capacitor drives the display having memory capability, it is necessary to repeatedly apply the predetermined voltage to the electro optic medium 123 if the response time is longer than the scanning time.

The second problem of the display methods having memory capability is that the specific resistance of the electro optic medium 123 is lower than the conventional liquid crystal. When the conventional technology that is constructed with one transistor and one capacitor drives the display having memory capability, it is not possible to hold the voltage written in the capacitor in a one-frame holding period due to the leakage of such low specific resistance of the electro optic medium 123. Therefore the actual voltage applied to the electro optic medium 123 becomes low and the more scanning on the display for re-writing the display images are necessary. Further the time necessary to re-write the display images becomes longer than the response time that is for consistently same voltage of the driving voltage applied to the electro optic medium 123.

These problems are not serious for the display device which has lines in a limited quantity. However, they become serious for the display devices that have high resolution and extremely large number of lines.

There is an under limit for selecting term of a line due to the limit of ON state resistance of the transistor and the increase of line number results in the increase of the term for scanning one-frame. Due to the increase of scanning interval, the effective voltage applied to the electro optic medium 123 becomes low and more time for scanning is required to suppress the voltage lowering. Therefore the time for re-writing images increases in large extent due to the high resolution of the display which is the conventional active matrix display that has a construction of one transistor and one capacitor and memory capability. The apparatus that has the display which takes long time for re-writing images has rather poor performance and less operation capability.

The pixel circuit configuration and the driving method to solve this problem are explained as follows. The pixel circuit is shown in the first embodiment and shown in FIG. 2. The first transistor 121 is connected to the scanning signal line 109 at the gate and the drain or the source of the first transistor 121 is connected to the image signal line 110. The rest of the source or the drain is connected to the image signal memory 124 and the gate of the second transistor 122.

The drain or the source of the second transistor 122 is connected to the reference voltage line 108 and the rest of the source or the drain of the second transistor is connected to a terminal of the electro optic medium 123. The other terminal of the electro optic medium 123 is connected to the common electrode 120. The common electrode 120 is formed on either the same substrate or the facing substrate of the TFT or both substrates.

Figure 41:
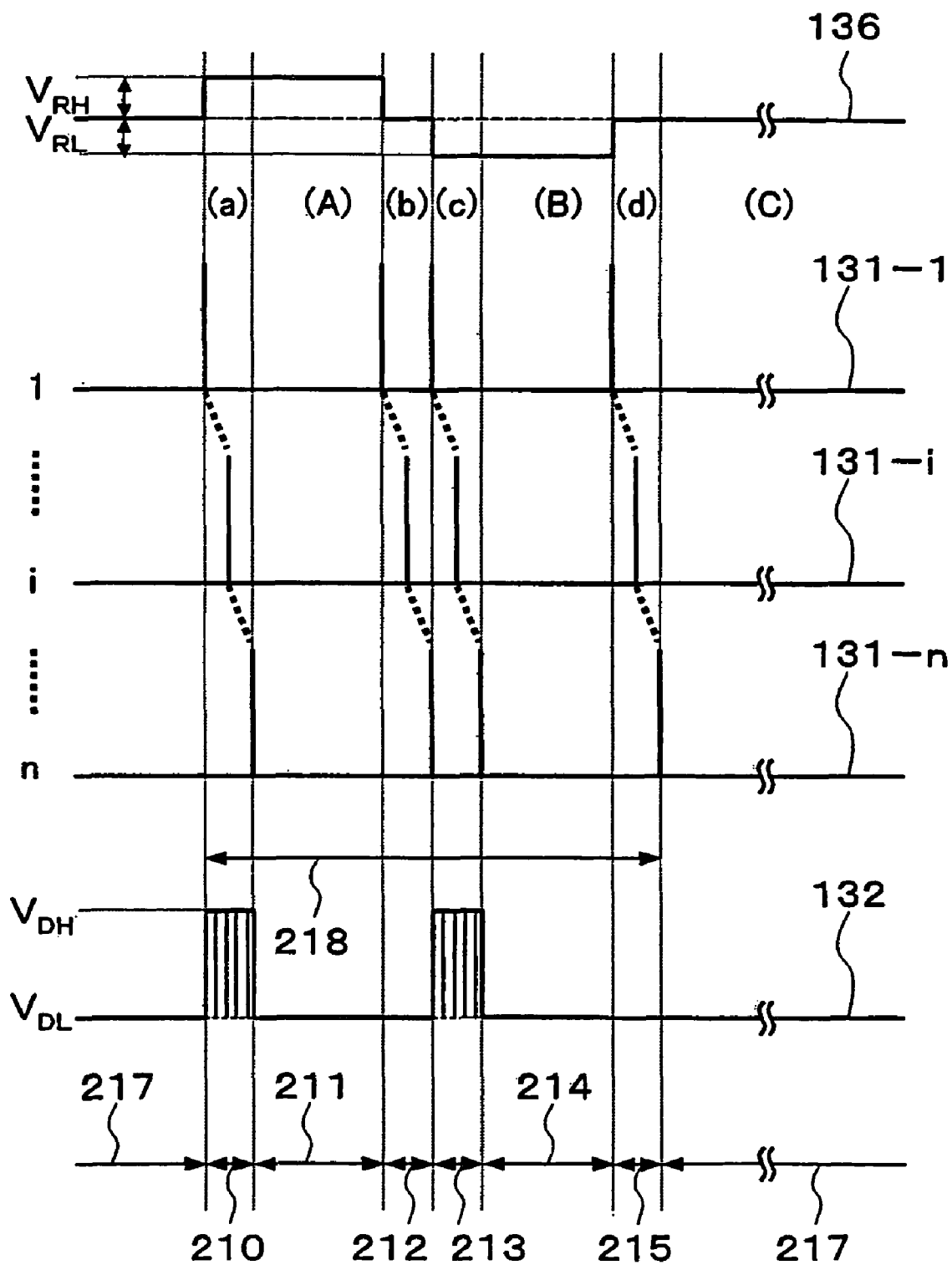
FIG. 41 is a drawing that shows the driving waveform of the third embodiment.

FIG. 41 shows the driving waveform used for the present embodiment. The horizontal axis shows the time. The sequence is basically divided into an image re-writing period 218 and an image holding period 217. The image re-writing period 218 is further divided into scanning intervals (a) 210 to (d) 215 and holding periods (A) 211 and (B) 214.

The driving waveform 136 of the reference voltage line 108 is set to be $V_{RH}$ for the scanning interval (a) to the holding period (A), fundamentally the common voltage $V_{COM}$ (or "common potential"), $V_{RL}$ for the scanning interval (c) to the holding period (B) and the common potential $V_{COM}$ for the scanning interval (d) and the holding period (C) 217.

In the scanning interval (a), the voltage 132 of the image signal line 110 sets the scanning signal line 109 in H level ($V_{DH}$) at the timing of selecting the scanning signal line 109 only for the pixel of which image signal terns from black to white. The second transistor 122 becomes ON state of the pixel which is set in H level ($V_{DH}$ is applied) and the driving waveform 136 ($V_{RH}$) of the reference voltage line 108 is applied to the electro optic medium 123. The number of scanning time shown in the scanning interval (a) in FIG. 41 is one time but can be more than one.

In the holding period (A), the voltage 132 of the image signal line 110 is set in L level ($V_{DL}$) and the scanning is paused. In the holding period (A), the second transistor 122 of the pixel which is set in H level ($V_{DH}$) is ON state and the voltage 136 ($V_{RH}$) of the reference voltage line 108 is applied to and held in the electro optic medium 123. For the holding period (A), it is preferable to hold sufficiently enough time so that the optical response of the pixel which turns to white from black is saturated.

In the scanning interval (b) 212, the voltage 132 of the image signal line 110 is set in L level ($V_{DL}$) and all scanning signal lines 109 are scanned so that all second transistors 122 are set to be OFF state. In the scanning interval (b), the voltage 136 of the reference voltage line 108 is preferred to be set in the common voltage.

In the scanning interval (c) 213, the voltage 132 of the image signal line 110 is set the scanning signal line 109 in H level ($V_{DH}$) at the timing of selecting the scanning signal line 109 only for the pixel of which image signal terns to black from white. The second transistor 122 becomes ON state of the pixel which is set in H level ($V_{DH}$ is applied) and the voltage 136 ($V_{RH}$) of the reference voltage line 108 is applied to the electro optic medium 123. The scanning time shown in the scanning interval (c) in FIG. 41 is one time but can be more than one.

In the holding period (B), the voltage 132 of the image signal line 110 is set in L level ($V_{DL}$) and the scanning is paused. In the holding period (B), the second transistor 122 of the pixel which is set in H level ($V_{DH}$) is ON state and the voltage 136 ($V_{RH}$) of the reference voltage line 108 is applied to and held in the electro optic medium 123. For the holding period (B), it is preferable to hold sufficiently enough time so that the optical response of the pixel which turns to black from white is saturated.

In the scanning interval (d), the voltage 132 of the image signal line 110 is set in L level ($V_{DL}$) and all scanning signal lines 109 are scanned so that all pixel voltages are set to be the common voltage.

In the holding period (C), the voltage 132 of the image signal line 110 is set in L level ($V_{DL}$) and the scanning of the scanning signal lines 109 are paused.

As discussed before, the electro optic medium 123 of the display that has a memory capability generally has low specific resistivity and it is not possible to hold the driving voltage applied to the electro optic medium 123 for a one-frame term. Therefore, extreme longer time than the intrinsic response time of the electro optic medium 123 is required for re-writing images.

On the other hand, the display that has a memory capability can be driven by the pixel circuit configuration and the driving method of the present embodiment so that it is possible to consistently apply the driving voltage 135 of the reference voltage line 108 to the electro optic medium 123 through the second transistor 122 until the electro optic medium 123 sufficiently responds in re-writing time. Therefore, the term for rewriting images can be substantially same as the response time The present embodiment is described for binary display. On the other hand, it is possible to realize the multiple value display by the analogue gradation if a scanning and holding period such that the voltage of the reference voltage line 108 is set in the voltage other than $V_{RH}$ and $V_{RL}$ is added and the display medium that supports the multiple value presentation is used.

Figure 42:
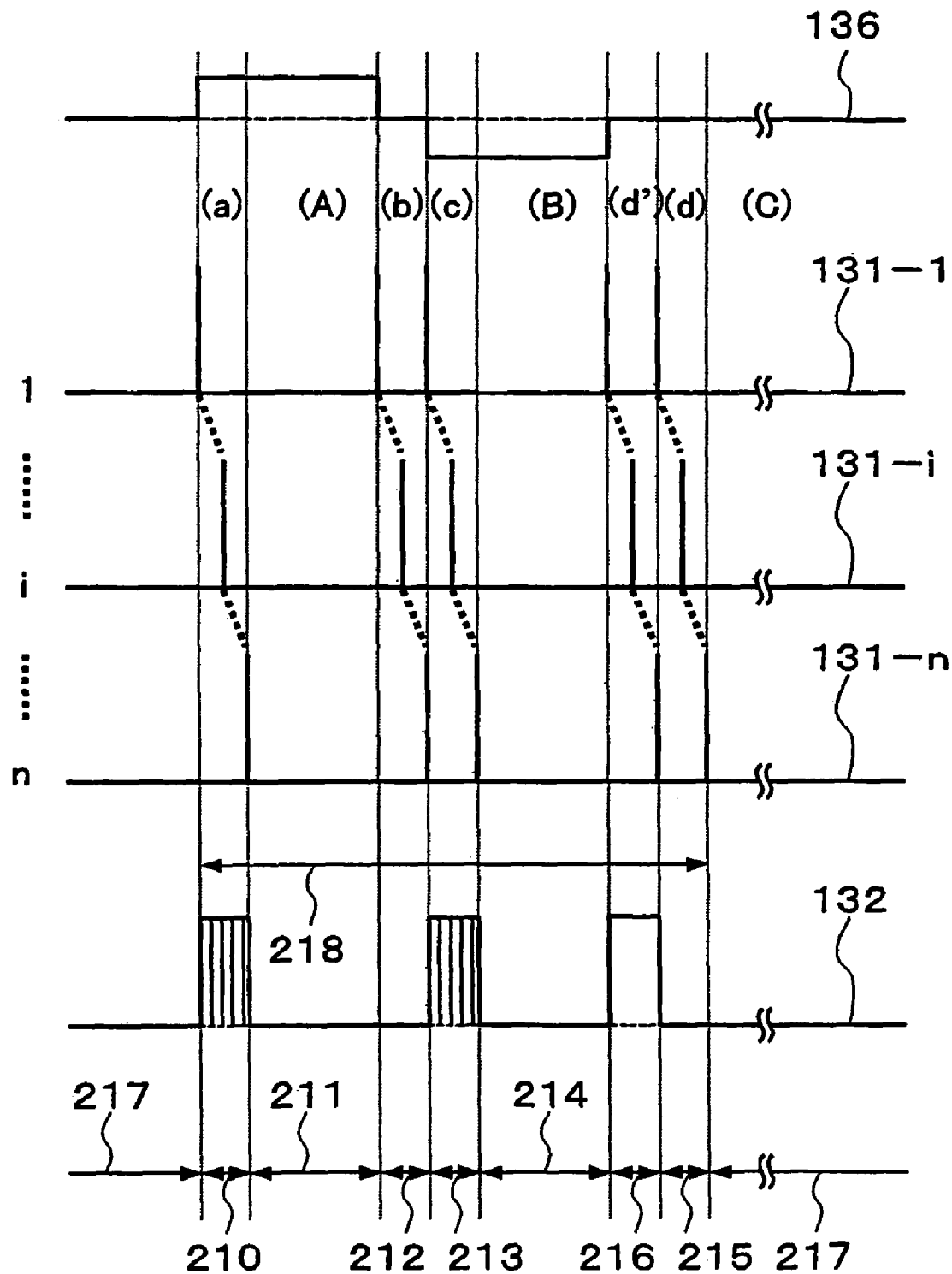
FIG. 42 is another drawing that shows the driving waveform of the third embodiment.

FIG. 42 shows another driving waveform in the present embodiment. The difference from FIG. 41 is that a scanning interval (d') is added. The operation in the scanning intervals (a) to (d) and the holding periods (A) to (C) are same as those in FIG. 41.

In the scanning interval (d'), the voltage 132 of the image signal line 110 is set in H level (VDH) and all scanning signal lines 109 are scanned so that all pixel voltages are set to be the common voltage. Adding the scanning interval (d'), both terminals of the electro optic medium 123 are equal and bad influence to the display due to the residual electric charges is inhibited.

In the present embodiment, the timing to change the voltage 136 of the reference voltage line 108 is common to all lines. It is preferred to scan the timing to change the voltage 136 of the reference voltage line 108 synchronously with the scanning of the scanning signal line 109 because the relative relation between the timing to select each line and the timing to change the voltage of the reference voltage line 108 is equal to all lines and dependency of the image display presentation for the scanning direction is reduced.

In the present embodiment, an example to re-write only the pixel that changes to white from black or to black from white is described by comparing before and after the data in re-writing. It is preferred to set H level ($V_{DH}$) to the voltage 132 of the image signal line 110 when the pixel of which data is white before and after re-writing is selected in terms of refreshing.

It is same for the case when the re-writing is done to black from white. In other words, all white is re-written in the holding period (A) and all black is re-written in the holding period (B). In this case, it is possible to eliminate the sequence to extract the difference obtained by the comparison of the image data before and after the re-writing and the circuit to carry out the sequence.

FOURTH EMBODIMENT

Figure 43:
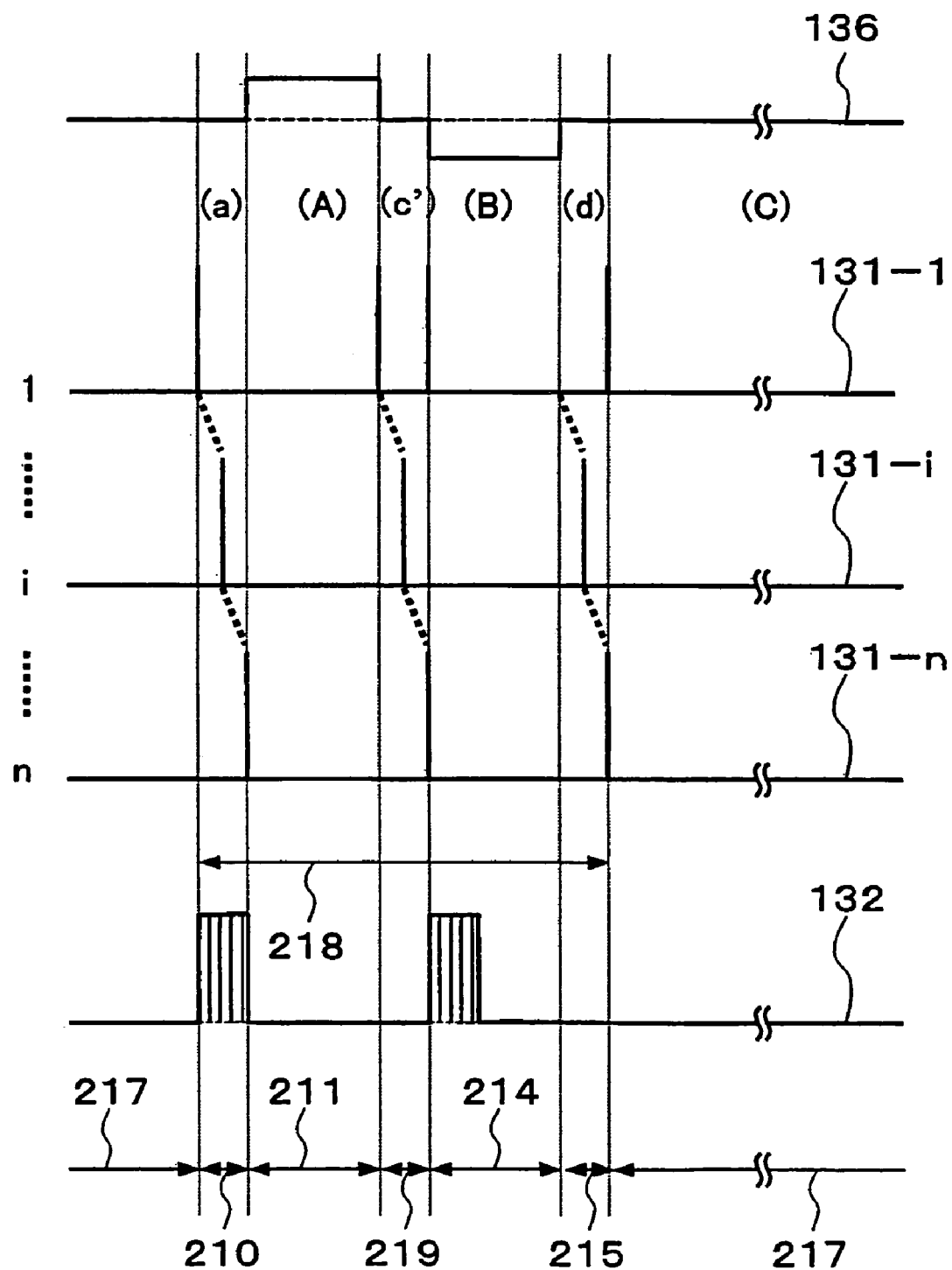
FIG. 43 is a drawing that shows the driving waveform of the fourth embodiment.
Figure 44A:
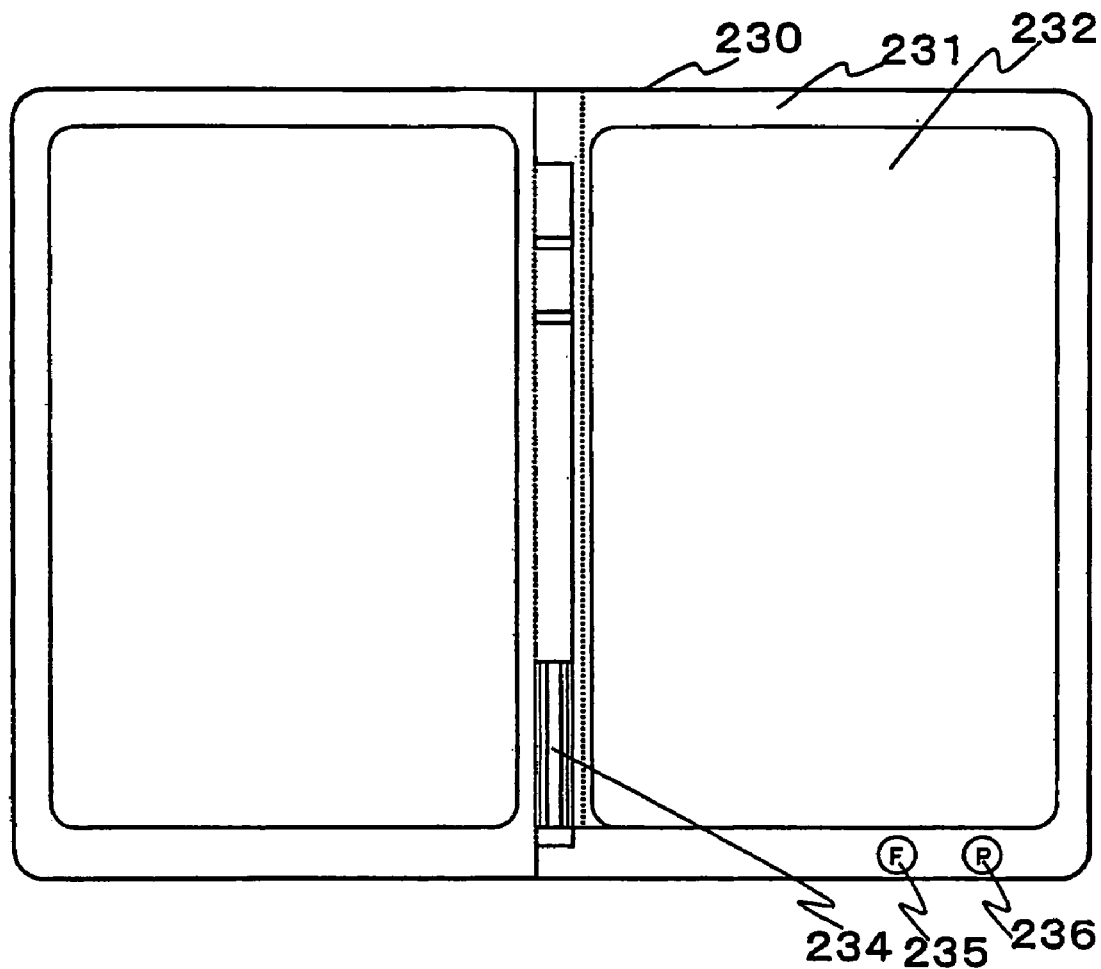
FIG. 44 is a drawing that shows an e-book to which the display device regarding the present invention is applied.
Figure 44B:
Figure 44C:
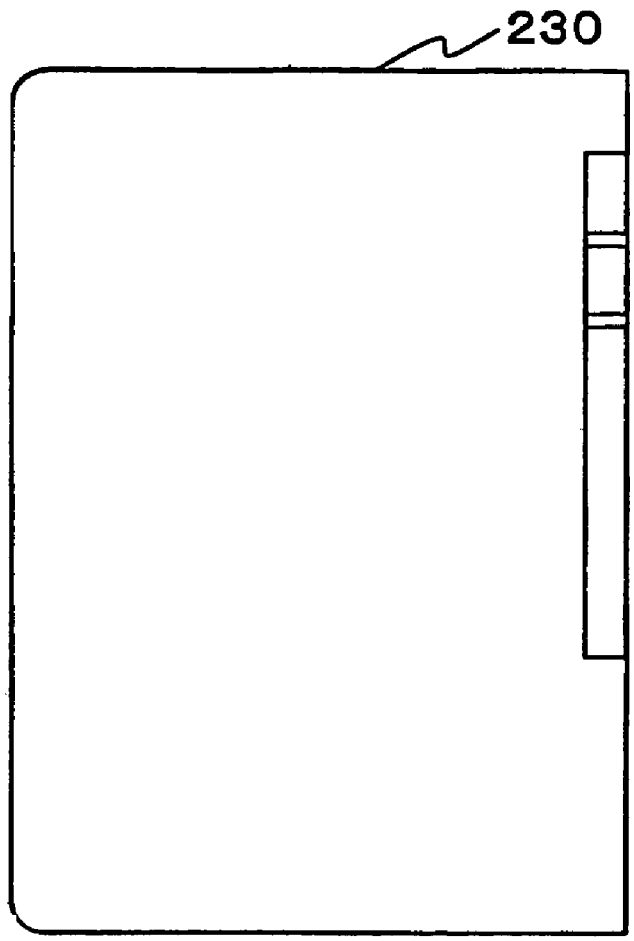
Figure 44D:

FIG. 43 shows the driving waveform of the present embodiment. The difference from FIG. 41 is the scanning interval (C') 219 which is paired with the scanning interval (b) and the scanning interval (c) and the common voltage which replaces the voltage 136 of the reference voltage line 108 in the scanning voltage terms (a) and (c').

In the scanning interval (c'), the voltage 132 of the image signal line 110 is set in L level ($V_{DL}$) at the timing of selecting the scanning signal line 109 of the pixel (of which second transistor 122 is set ON) which is re-written from black to white in the scanning interval (a) as well as the voltage of the image signal line 110 is set in H level ($V_{DH}$) at the timing of selecting the image signal line 110 of the pixel which is re-written from white to black.

In this operation, both terminals of the electro optic medium 123 for the pixel which is re-written from black to white become equal. The second transistor of the pixel becomes OFF state and the pixel is not influenced by the voltage fluctuation of the reference voltage line 108 after then.

In the scanning intervals (a) and (c'), the voltage 136 of the reference voltage line 108 is set to be the common voltage and the voltage 136 of the reference voltage line 108 after the scanning interval is changed in order to equalize the timings for the upper line and the lower line to change black to white or white to black.

FIG. 44 shows an example of application of the present invention to an e-book reader. A display device 232 is installed in the frame 231 of the main body 230. The display device regarding to the present invention is used for this display device 232. FIG. 44A shows the horizontal view of the e-book reader which is opened. The physical dimensions are, for example, 204 mm width and 151 mm length. FIG. 44B shows the bottom surface of the e-book reader shown in FIG. 44A. The physical dimensions are, for example, 3 mm thickness. FIG. 44C shows the e-book reader which is closed. The physical dimensions are, for example, 205 mm width and 151 mm length. FIG. 44D shows the bottom surface of the e-book reader shown in FIG. 44C. The physical dimensions are, for example, 6 mm thickness. The e-book is folded around the open/close axis 233. The manipulation buttons 234 to turn over or back the pages, function buttons 235 to set the functions and a power on/off button are installed.

What is claimed:

1. A display device which has plural pixels aligned in a matrix form on a substrate, comprising:
    each pixel having at least a first transistor, a second transistor, an image signal memory, an electro optic medium and a common electrode, and wherein each pixel is connected to at least an image signal line, a scanning signal line and a reference voltage line, wherein
    either a drain or a source and the other of said source or said drain of said first transistor are respectively connected to said image signal line and a gate of said second transistor;
    a gate of said first transistor is connected to said scanning signal line;
    either a drain or a source and the other of said source or said drain of said second transistor are respectively connected to said electro optic medium and said reference voltage line;
    said image signal memory is connected to said gate of said second-transistor and said common electrode;
    said electro optic medium is connected to said drain or said source of said second transistor and said common electrode,
    said electro optic medium maintains a displayed image after power is switched off,
    a voltage of said reference voltage line sequentially takes at least three different voltages including a voltage similar to a voltage of said common electrode, and
    said electro optic medium has at least two image displays that are independently written in said electro optic medium in an image re-writing period including a first scanning interval for rewriting said electro optic medium from black to white and a second scanning interval for rewriting said electro optic medium from white to black, and
    a plurality of pixels are rewritten in the image re-writing period, and for the first scanning interval, only scanning lines for pixels to be written from black to white are turned on, and for the second scanning interval, only scanning lines for pixels to be written from white to black are turned on.

2. A device according to claim 1, wherein after the first scanning period, scanning lines are scanned to turn off the second transistor.

3. A device according to claim 1, wherein voltages of pixel electrodes of all of said pixels which are effective for image display are set to be a voltage similar to voltage of said common electrode at an end of an scanning interval to scan said scanning signal line.

4. A device according to claim 1, wherein voltage of said reference voltage line is set to be a voltage similar to said common electrode in a scanning interval when said second transistor is set to be OFF state.

5. A device according to claim 4, wherein scanning of said reference voltage line is carried out synchronously with scanning of said signal scanning line.

* * * * *